United States Patent
Feiweier et al.

(10) Patent No.: US 9,453,896 B2
(45) Date of Patent: Sep. 27, 2016

(54) METHOD AND APPARATUS FOR MAGNETIC RESONANCE IMAGING

(71) Applicants: Thorsten Feiweier, Poxdorf (DE); Bernd Kuehn, Uttenreuth (DE)

(72) Inventors: Thorsten Feiweier, Poxdorf (DE); Bernd Kuehn, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 1022 days.

(21) Appl. No.: 13/649,326

(22) Filed: Oct. 11, 2012

(65) Prior Publication Data

US 2013/0088228 A1 Apr. 11, 2013

(30) Foreign Application Priority Data

Oct. 11, 2011 (DE) .................. 10 2011 084 289

(51) Int. Cl.
*G01R 33/56* (2006.01)
*G01R 33/38* (2006.01)
*G01R 33/483* (2006.01)

(52) U.S. Cl.
CPC ....... *G01R 33/4838* (2013.01); *G01R 33/5607* (2013.01)

(58) Field of Classification Search
CPC .................. G01R 33/4838; G01R 33/5607
USPC ....... 324/306, 307, 309, 310, 312–314, 318, 324/319, 322; 600/410, 413, 419
See application file for complete search history.

(56) References Cited

U.S. PATENT DOCUMENTS

| | | |
|---|---|---|
| 2003/0218459 A1 | 11/2003 | Reddy et al. |
| 2009/0048505 A1 | 2/2009 | Kuth et al. |
| 2009/0267604 A1 | 10/2009 | Umeda |
| 2009/0289631 A1 | 11/2009 | Van Den Brink et al. |
| 2010/0013478 A1 | 1/2010 | Abe et al. |
| 2010/0160767 A1* | 6/2010 | Deimling ........... G01R 33/5613 600/419 |
| 2010/0277169 A1 | 11/2010 | Feiweier |
| 2011/0213235 A1 | 9/2011 | Arai |

(Continued)

FOREIGN PATENT DOCUMENTS

| | | |
|---|---|---|
| CN | 101138497 A | 3/2008 |
| CN | 101441255 A | 5/2009 |

OTHER PUBLICATIONS

Zur et al: "Spoiling of Transverse Magnetization in Steady-State Sequences", Magnetic Resonance in Medicine vol. 21, pp. 251-263, (1991).

(Continued)

*Primary Examiner* — Melissa Koval
*Assistant Examiner* — Rishi Patel
(74) *Attorney, Agent, or Firm* — Schiff Hardin LLP

(57) ABSTRACT

In a method and apparatus for magnetic resonance (MR) imaging, a magnetization of nuclear spins in a subject is prepared in multiple preparation modules of an acquisition sequence. MR signals are acquired with at least one imaging module of the sequence. Spoiler gradient fields are generated in the multiple preparation modules in order to affect a transverse magnetization of the spins. The spoiler gradient fields that are applied in at least two different preparation modules are spatially varied along different directions. Spoiler gradient moments of the spoiler gradient fields are selected so that, for at least one of three orthogonal spatial directions, a weighted sum of the spoiler gradient moments that are applied along this spatial direction satisfies a threshold condition.

21 Claims, 13 Drawing Sheets

(56) References Cited

U.S. PATENT DOCUMENTS

2011/0267055 A1 11/2011 Umeda
2012/0112743 A1* 5/2012 Granlund ............ G01R 33/5614
324/309

OTHER PUBLICATIONS

Klaus Scheffler: "A Pictorial Description of Steady-States in Rapid Magnetic Resonance Imaging", Magnetic Resonance, vol. 11(5) pp. 291-304 (1999).

Wang et al: "A Spoiling Sequence for Suppression of Residual Transverse Magnetization", MRM 15, pp. 175-191, (1990).

Denolin et al.,New insights into the mechanisms of signal formation in RF-spoiled gradient echo sequences, In: Magn. Reson. Med., vol. 54, pp. 937-954 (2005).

V.L. Yarnykh, Optimal radiofrequency and gradient spoiling for improved accuracy of T1 and B1 measurements using fast steady-state techniques, In: Magn. Reson. Med., vol. 63, pp. 1610-1626 (2010).

* cited by examiner

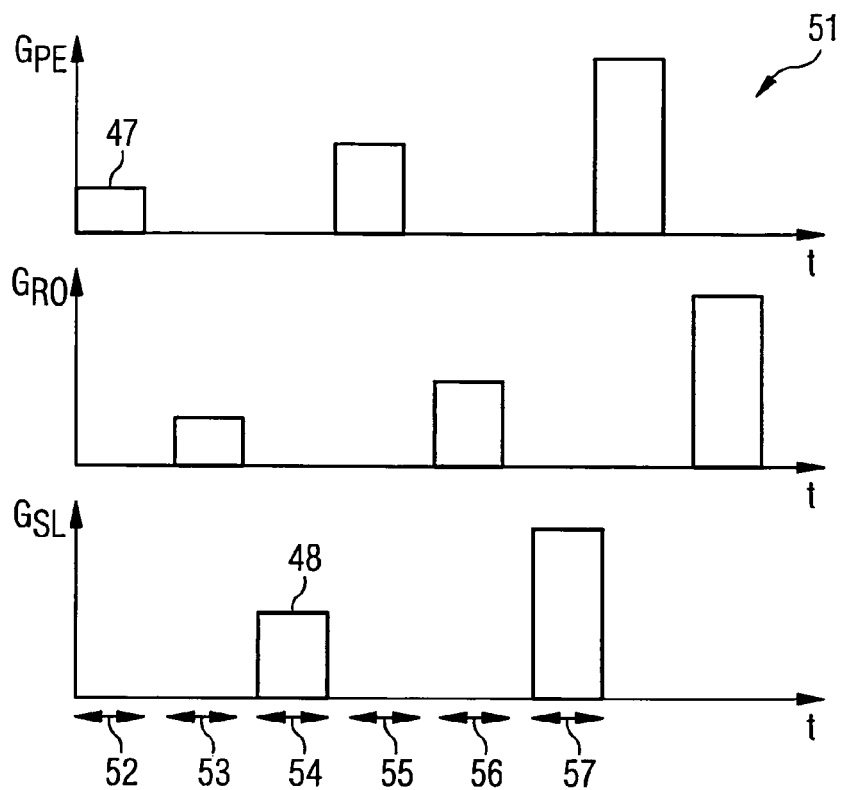
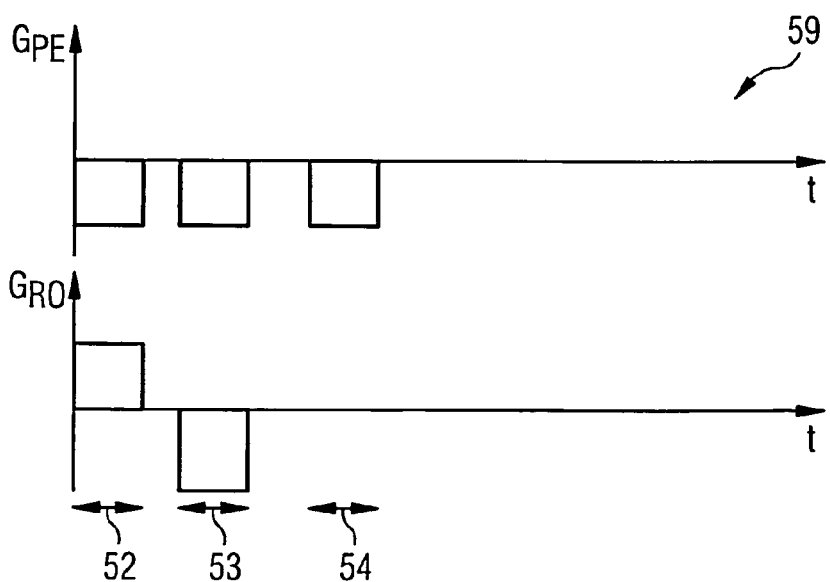

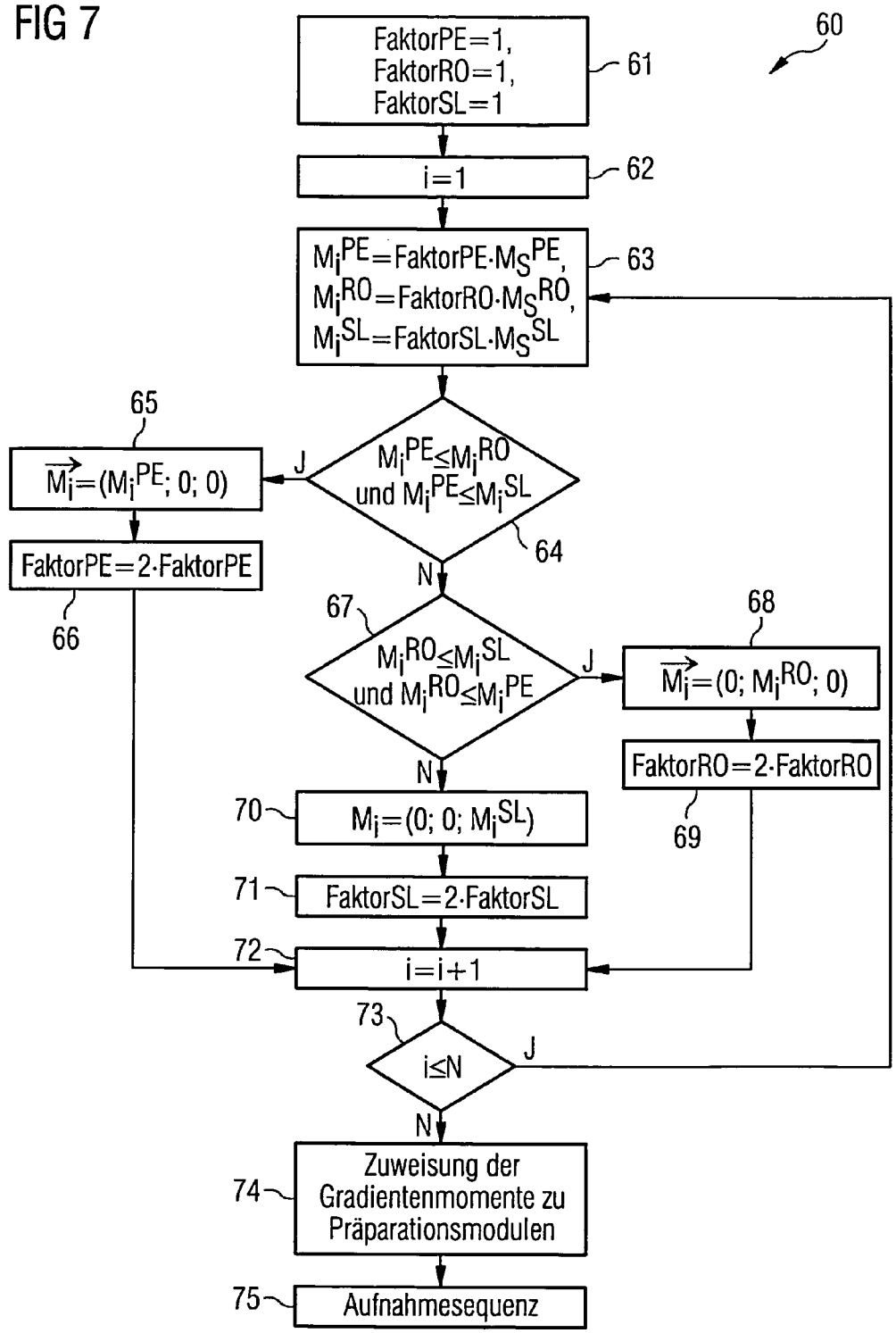

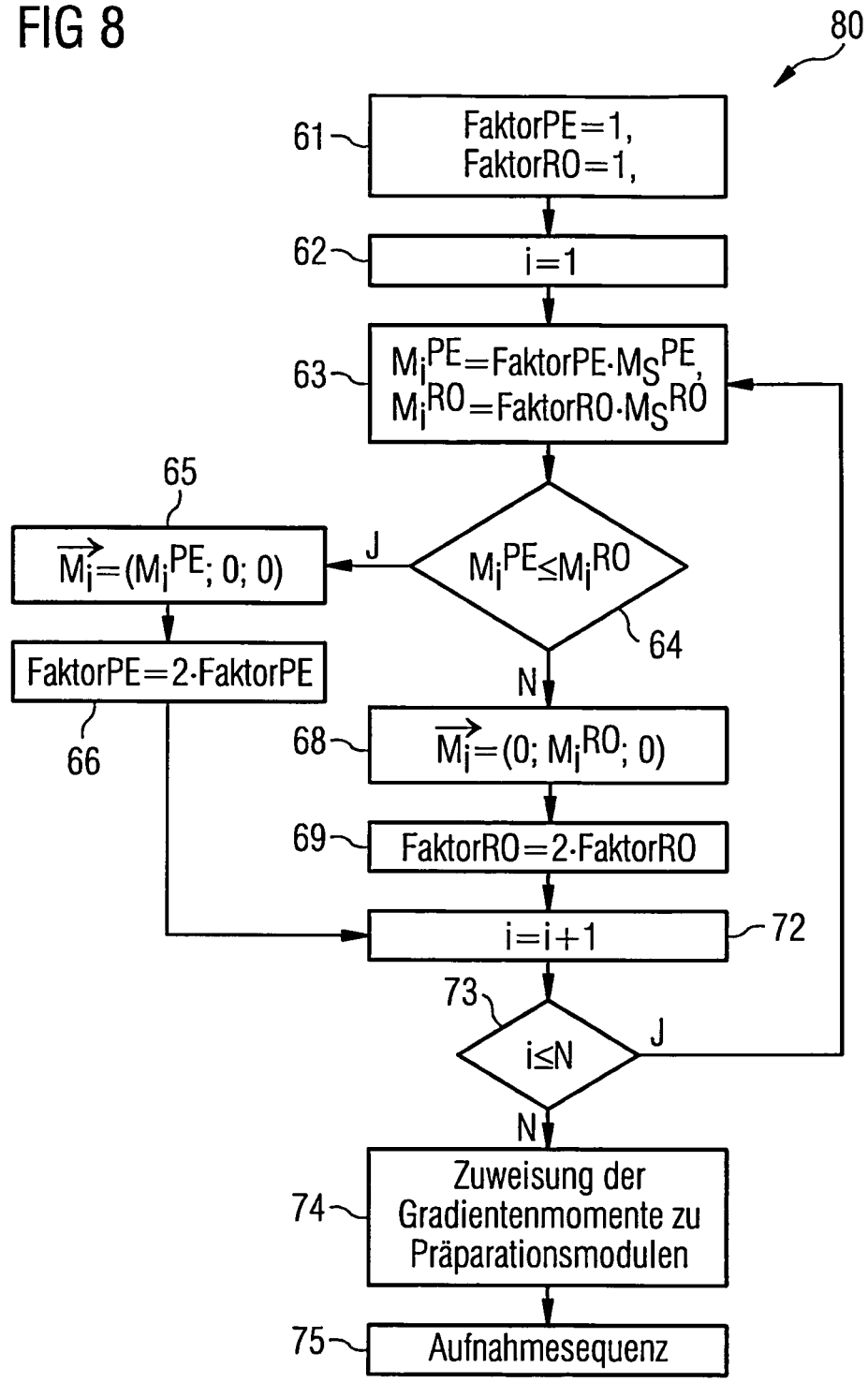

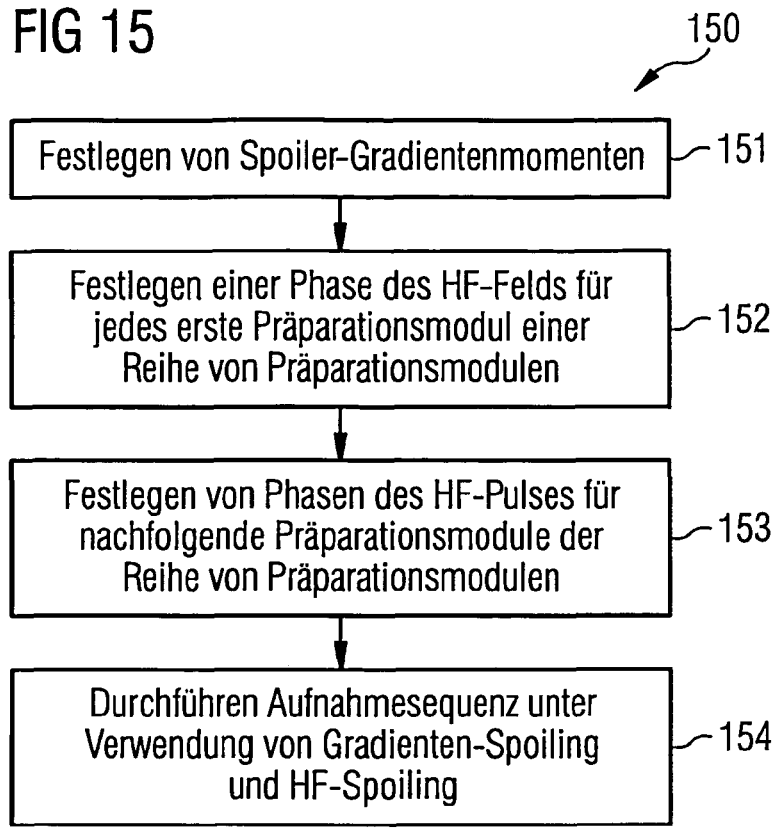
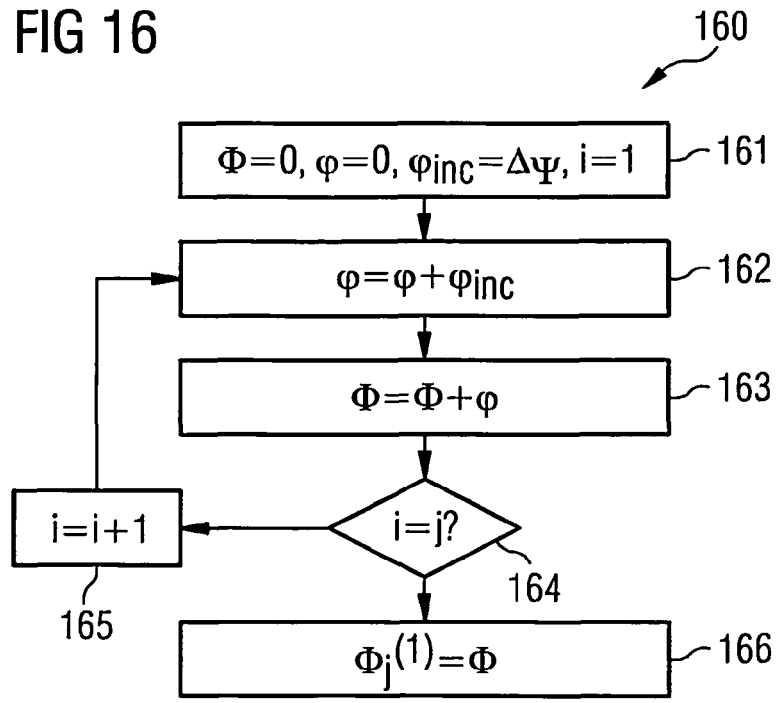

FIG 19
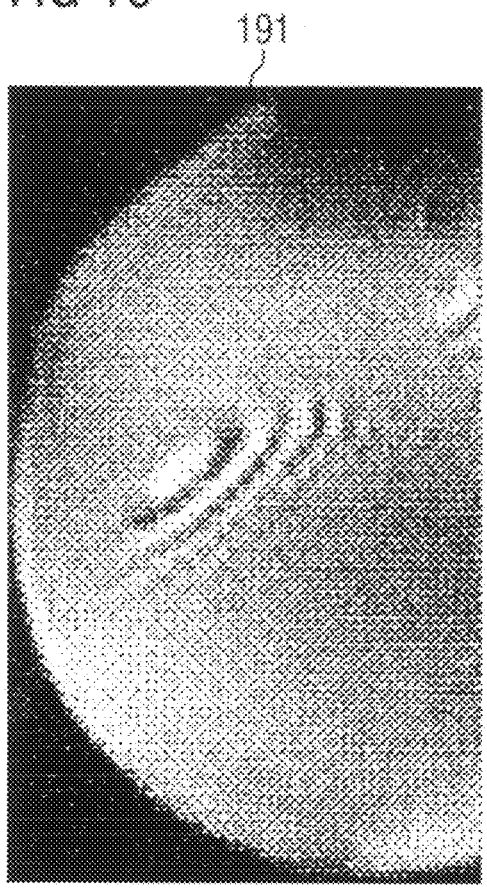 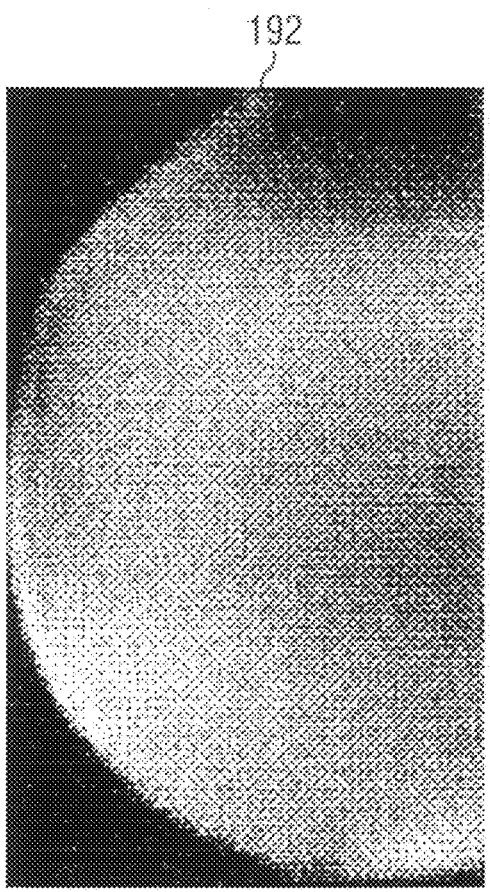

METHOD AND APPARATUS FOR MAGNETIC RESONANCE IMAGING

BACKGROUND OF THE INVENTION

1. Field of the Invention

The invention concerns a method and an apparatus for magnetic resonance imaging. In particular, the invention concerns such a method and such an apparatus in which a transverse magnetization can be specifically dephased using one or more gradient pulses in preparation of the magnetization.

2. Description of the Prior Art

Magnetic resonance (MR) imaging is an imaging modality that is used for examination and diagnosis in many fields of medicine. It based on the physical effect of nuclear magnetic resonance. To acquire MR signals, a defined longitudinal magnetization is generated or suppressed in a preparation module or multiple preparation modules of an imaging sequence. The dynamics of the nuclear spins can be observed after radiating radio-frequency pulses.

In MR imaging, the suppression of unwanted signal contributions is gaining high importance. For example, in the clinical routine, signal contributions from specific regions should regularly be suppressed in order to reduce motion or pulsation artifacts that (for example) result from breathing or blood flow, in particular in arteries. Alternatively or additionally, the imaging should be accelerated, for example by reducing the observation region ("Field of View", FOV), or by suppression of outer image regions ("Outer Volume Suppression", OVS). Moreover, methods should also be used in which specific spin types can be selectively suppressed that have an exceptional chemical shift. For example, a suppression of signal portions of fat, water or silicon can be achieved in this manner.

One or more radio-frequency (RF) excitation pulses with which the signal to be suppressed is specifically excited—i.e. is converted from longitudinal magnetization into transversal magnetization—can be used for signal suppression. Alternatively or additionally, a gradient pulse or multiple gradient pulses can be used in order to dephase the transverse magnetization so that the transverse magnetization delivers a strongly reduced contribution or no contribution in the following imaging modules of the sequence. This is also designated as "gradient spoiling" or "spoiling".

Imaging sequences are known in which measures to suppress specific signal contributions are implemented in chronological sequence in different preparation modules, but such measures can lead to unwanted coherence paths. The interaction of the spoiler gradient fields or spoiler RF fields that are used in different preparation modules can lead to an unwanted rephasing of the signal contributions that should actually be suppressed. A semi-classical theoretical description of such an unwanted rephasing for gradient fields that are spatially variable only in a predetermined spatial direction and are generated during the imaging is provided by K. Scheffler in "A Pictorial Description of Steady-States in Rapid Magnetic Resonance Imaging", Concepts in Magnetic Resonance 11, 291-304 (1999).

Unwanted signal contributions can also occur due to non-ideal conditions in the contrast preparation. For example, some imaging methods use RF pulses for preparation of a saturation contrast or an inversion contrast. The longitudinal magnetization that is used for imaging is initially saturated or inverted and signals caused thereby are acquired with one or more imaging modules after a defined wait time. The saturation can take place by excitation by an RF pulse and subsequent dephasing. The inversion can take place by the application of an RF inversion pulse. In such methods as well, it is desirable to suppress unwanted signal coherence paths.

Various techniques can be used to suppress unwanted coherence paths. For example, a technique known as RF spoiling is known. An exemplary method to suppress unwanted signal coherences via RF spoiling is described by Y. Zur in "Spoiling of Transverse Magnetization in Steady-State Sequences", MRM 21, 251-263 (1991). RF spoiling is suitable to effectively suppress the unwanted coherences of RF pulses generated in short and constant time intervals. However, RF spoiling can be difficult to apply in certain methods or can deliver an insufficient suppression of unwanted coherence paths in which only a few preparation modules are used. Examples of such methods are saturation or contrast preparation methods.

Gradient spoiling can be alternatively or additionally used. Gradient spoiling is well suited to dephasing selectively generated transversal magnetizations. A conventional gradient spoiling in which the same gradient moment of the spoiler gradient field is always used in different preparation modules can lead, however, to unwanted coherence paths as described above. An exemplary method for suppression of unwanted signal coherences by gradient spoiling is described by H. Z. Wang and S. J. Riederer in "A Spoiling Sequence for Suppression of Residual Transverse Magnetization", MRM 15, 175-191 (1990). Although such semi-empirical methods suppress unwanted signal coherences, they can lead to a rapid growth of the necessary gradient moments. For example, a doubling of the gradient for a specific, predetermined direction takes place in H. Z. Wang and S. J. Riederer, "A Spoiling Sequence for Suppression of Residual Transverse Magnetization", MRM 15, 175-191 (1990). Given a large number of preparation modules, it is possible that the required large gradient moments can no longer be generated, or they may entail severe limitations in the temporal progression of the measurement sequence.

DE 10 2009 019 895 B4 describes a method and a device for diffusion-weighted acquisition of MR signals in which gradient spoiling is used. The spoiler gradient fields spatially vary along one direction.

SUMMARY OF THE INVENTION

An object of the invention is to provide an improved method and apparatus for magnetic resonance imaging. In particular, the invention has the object to provide a method and apparatus for magnetic resonance imaging wherein efficient gradient spoiling can be achieved with smaller gradient moments.

According to one aspect of the invention, a method for magnetic resonance (MR) imaging with an acquisition sequence includes multiple preparation modules and at least one imaging module. The method includes preparation of a magnetization in the multiple preparation modules and acquisition of MR signals in the at least one imaging module. In the multiple preparation modules, spoiler gradient fields are generated in order to affect a transverse magnetization. A spoiler gradient field that spatially varies (changes) along one direction is generated in one preparation module and, in an additional preparation module, a spoiler gradient field that spatially varies along a different direction is generated. The spoiler gradient moments of the spoiler gradient fields are selected so that, for at least one of three orthogonal spatial directions, a weighted sum of the spoiler gradient moments that are applied along this spatial direction satisfies a threshold condition.

In the method, spoiler gradient fields that vary with spatial dependency in different directions are generated in at least two of the preparation modules. The growth of the required spoiler gradient moments of the spoiler gradient fields can be slowed by utilizing the multiple spatial dimensions. Due to the requirement that a threshold condition be satisfied for at least one of the three orthogonal spatial directions, unwanted coherence paths can be reliably suppressed and the spoiler gradient moments of the spoiler gradient fields can be systematically selected.

The method can include establishment of the spoiler gradient moments for the multiple preparation modules, with the establishment proceeding by an iterative method. The spoiler gradient moments can thereby be systematically selected so that unwanted coherence paths are reliably suppressed.

In each iteration of the iterative method, a spoiler gradient moment for a first spatial direction of the three orthogonal spatial directions can be established depending on a second maximum of spoiler gradient moments for a second spatial direction of the three orthogonal spatial directions that is different than the first spatial direction. The second maximum is a maximum of spoiler gradient moments for spoiler gradient moments applied along the second spatial direction, the second maximum having been established in the preceding iterations of the iterative method. In this way it can be systematically determined in which direction a spoiler gradient field should be spatially variable in order to avoid growth of the required spoiler gradient moments that is too strong.

In each iteration, the spoiler gradient moment for the first spatial directions can furthermore be established depending on a first maximum of spoiler gradient moments for the first spatial direction, the first maximum having been established in the preceding iterations of the iterative method. In this way it can be determined in which direction the spoiler gradient field established in the corresponding iteration should be spatially variable so that the threshold condition is satisfied.

In each iteration, the spoiler gradient moment for the first spatial directions can furthermore be established depending on a third maximum of spoiler gradient moments for a third spatial direction, the third maximum having been established in the preceding iterations of the iterative method. The third spatial direction is orthogonal to the first spatial direction and to the second spatial direction. In this way, all three spatial directions in which spoiler gradient moments can vary can be taken into account in the establishment of the spoiler gradient moments.

Each iteration can include a comparison of twice the first maximum with the second maximum. Each iteration can include establishment of the spoiler gradient moment for the first spatial direction depending on the result of the comparison. A geometric series of spoiler gradient moments thus can be generated systematically, wherein a doubling of the spoiler gradient moment for one of the three spatial directions takes place selectively so that the maximum amplitude of the required spoiler gradient moments is kept as small as possible.

The method can include a sequential filling of a multidimensional population matrix that is defined in the mathematical domain of spoiler gradient moments. In this way the spoiler gradient moments for the spoiler gradient fields can be established simply and systematically. This is also possible by generating spoiler gradient moments for multiple of the three orthogonal spatial axes in a preparation module, i.e. making the spoiler gradient field in the preparation module spatially variable along a direction that is not parallel to any of the three spatial directions.

The iterative method can include an exclusion of fields of the population matrix depending on the threshold condition. Fields can thus be excluded from a selection of spoiler gradient moments in subsequent iterations, even if no spoiler gradient moments that correspond to the corresponding field of the population matrix were chosen in the previous iterations, Maintaining the threshold condition for at least one of the three orthogonal spatial directions thus can be ensured.

In at least one of the preparation modules, a first spoiler gradient field that is spatially variable in one of the three orthogonal spatial directions can be generated. In at least one of the additional preparation modules, a second spoiler gradient field that is spatially variable in another of the three orthogonal spatial directions can be generated. A spoiler gradient moment of the first spoiler gradient field can be a whole-number multiple of a first threshold. A spoiler gradient moment of the second spoiler gradient field can be a whole-number multiple of a second threshold. In this way, different extents of an imaging voxel in the three spatial directions can be taken into account in the systematic establishment of the spoiler gradient moments utilizing multiple dimensions.

The first threshold and the second threshold can be different. Greater flexibility and more certain suppression of unwanted coherences are thereby achieved even for imaging voxels that are not cuboid.

The first threshold can be established depending on an extent of the imaging voxel in the one of the three orthogonal spatial directions. The second threshold can be established depending on an extent of the imaging voxel in the other of the three orthogonal spatial directions. The dimensions of the imaging voxel are thereby systematically taken into account.

Both a first spoiler gradient field that is spatially variable in a first spatial direction of the three orthogonal spatial directions, and a second spoiler gradient field that is spatially variable in a second spatial direction (that is different than the first spatial direction) of the three orthogonal spatial directions, can be generated in at least one of the preparation modules. The degrees of freedom that are provided in the establishment of the spoiler gradient moments can be utilized in order to slow a growth of the required spoiler gradient moments with increasing number of preparation modules.

The three orthogonal spatial directions can correspond to a phase coding direction, a frequency coding direction and a slice selection direction. Devices for MR imaging normally have suitable gradient coils for these spatial directions. These can be used in order to generate the spoiler gradient fields with the desired established spoiler gradient moments.

Given the weighted sum that must satisfy the threshold condition, the weighting coefficients with which the spoiler gradient moments are multiplied can respectively be selected from the group $\{-1; 0; 1\}$. The spoiler gradient moments can be established so that multiple weighted sums in which the weighting coefficients with which the spoiler gradient moments are multiplied are respectively selected from the group $\{-1; 0; 1\}$ satisfy one of multiple threshold conditions. In this way, independently of whether an RF pulse refocuses the transverse magnetization (for example), a desired suppression of specific signals is achieved.

In the method, the spoiler gradient moments of the spoiler gradient fields can be selected so that—for each N set of coefficients $\{f_1, f_2, \ldots, f_N\}$ that is not equal to $\{0, 0, \ldots, 0\}$ and in which each coefficient $f_i$ is selected with $1 \leq I \leq N$ from the group $\{-1; 0; 1\}$, wherein N designates a number of preparation modules—the following condition is satisfied for at least one spatial direction (designated with "Dir.") of the three orthogonal spatial directions:

$$|\Sigma_{i=1 \ldots N} f_i \cdot M_i^{Dir}| \geq M_S^{Dir} \tag{1}$$

wherein i designates an index for preparation modules. The direction Dir. is selected from a phase coding direction, a frequency coding direction and a slice selection direction. $M_i^{Dir}$ is a spoiler gradient moment for the corresponding spatial direction in the i-th preparation module. $M_S^{Dir}$ is a threshold associated with the corresponding spatial direction. Due to the condition that Equation (1) must be satisfied for each of the cited N-tuples of coefficients $\{f_1, f_2, \ldots, f_N\}$ for at least one respective spatial direction, the complexity of the possible spin dynamic is taken into account. For example, new RF pulses can produce an excitation (i.e. a conversion of longitudinal magnetization into transverse magnetization) and/or lead to a rephasing and/or to an additional dephasing. An RF pulse can also leave a portion of spins unaffected, for example if the B-field is directed parallel to the precessing spins. The different possibilities are taken into account by the different sets of coefficients of the weighted sums. A certain suppression of unwanted coherence signals can thus be achieved.

The threshold $M_S^{Dir}$ can be a constant. Given other embodiments, the threshold $M_S^{Dir}$ for at least one of the three spatial directions can be selected depending on the N-tuple of coefficients $\{f_1, f_2, \ldots, f_N\}$. It can be taken into account that different coherence paths are associated with different strengths, i.e. the paths respectively deliver signal contributions of different strengths. Through a selection of the threshold depending on the respective $N^{th}$ set, the threshold can be determined depending on this signal strength. The flexibility in the selection of the spoiler gradient moments thus can be additionally increased, and the growth of the spoiler gradient moments can be slowed.

A suppression can be achieved if the condition (1) is satisfied for one of the three orthogonal spatial directions. This means that the spoiler gradient moments can be selected so that at least one of the following conditions is alternately satisfied for each coefficient set:

$$|\Sigma_{i=1 \ldots N} f_i \cdot M_i^{PE}| \geq M_S^{PE} \text{ and/or} \tag{1a}$$

$$|\Sigma_{i=1 \ldots N} f_i \cdot M_i^{RO}| \geq M_S^{RO} \text{ and/or} \tag{1b}$$

$$|\Sigma_{i=1 \ldots N} f_i \cdot M_i^{SL}| \geq M_S^{SL}, \tag{1c}$$

wherein PE designates the phase coding direction, RO designates the frequency coding direction and SL designates the slice selection direction. The thresholds on the right side of Equations (1a)-(1c) do not all need to be the same. The spoiler gradient moments can be selected so that at least one of the spoiler gradient moments $M_i^{PE}$ differs from zero, and so that, furthermore, at least one of the spoiler gradient moments $M_i^{RO}$ and/or one of the spoiler gradient moments $M_i^{SL}$ differs from zero. The spoiler gradient moments can be selected so that at least one of the spoiler gradient moments $M_i^{PE}$ differs from zero, so that, furthermore, at least one of the spoiler gradient moments $M_i^{RO}$ differs from zero and, furthermore, so that at least one of the spoiler gradient moments $M_i^{SL}$ differs from zero. Different conditions of Equations (1a)-(1c) can be satisfied for different sets of coefficients $f_i$. For example, Equation (1a) can be satisfied for one set of coefficients and Equation (1b) can be satisfied for another set of coefficients.

The spoiler gradient moments can also be established so that the threshold condition is satisfied for at least two of the three spatial directions, meaning that at least two of the Equations (1a)-(1c) are satisfied. The spoiler gradient moments can also be established so that the threshold condition for all three spatial directions is satisfied. The efficiency of the gradient spoiling can thereby be reliably maintained even for arbitrarily oriented saturation regions.

The spoiler gradient moments of the spoiler gradient fields can be established depending on an imaging gradient moment that is generated in the at least one imaging module. It is taken into account that the interaction between spoiler gradient fields in the preparation modules and the imaging gradient moment in the at least one imaging module can also lead to unwanted signal coherences. The readout sequence can include multiple imaging modules. In this case, the spoiler gradient fields can be established depending on the imaging gradient moments that are generated in the imaging modules. The same imaging gradient moment can be used in the different imaging modules.

The spoiler gradient moments of the spoiler gradient fields can be selected so that
for each $N^{th}$ set of coefficients $\{f_1, f_2, \ldots, f_N\}$, that is not identical $\{0, 0, \ldots, 0\}$ and in which each coefficient $f_i$ (with $1 \leq l \leq N$) is selected from a group $\{-1; 0; 1\}$, wherein N designates a number of preparation modules, and
for each $K^{th}$ set of coefficients $\{g_1, g_2, \ldots, g_K\}$ in which each coefficient $g_j$ (with $1 \leq j \leq K$) is selected from the group $\{-1; 0; 1\}$, wherein K designates a number of imaging modules,
the following condition is satisfied for at least one spatial direction (designated here as Dir.) of the three orthogonal spatial directions:

$$|(\Sigma_{i=1 \ldots N} f_i \cdot M_i^{Dir}) + (\Sigma_{j=1 \ldots K} g_j \cdot M_B^{Dir})| \geq M_S^{Dir}, \tag{2}$$

wherein i is an index for preparation modules. The index j is an index for imaging modules. The direction Dir. is selected from a phase coding direction, a frequency coding direction and a slice selection direction. $M_i^{Dir}$ is a spoiler gradient moment for the corresponding spatial direction in the $i^{th}$ preparation module. $M_B^{Dir}$ is an imaging gradient moment for the corresponding spatial direction in the multiple imaging modules. $M_S^{Dir}$ is a threshold associated with the corresponding spatial direction. Due to the condition that Equation (2) must be satisfied for the various coefficient tuples, the complexity of the possible spin dynamics is taken into account, as is explained in the context of Equation (1). Equation (2) applies for the case that the imaging gradient moment in the different imaging modules is the same. For different imaging gradient moments in different imaging modules, the spoiler gradient moments can be selected so that $$|(\Sigma_{i=1 \ldots N} f_i \cdot M_i^{Dir}) + (\Sigma_{j=1 \ldots K} g_j \cdot M_{B,j}^{Dir})| \geq M_S^{Dir}, \tag{3}$$

wherein $M_{B,j}^{Dir}$ is the imaging gradient moment in the $j^{th}$ imaging module.

A suppression of signal coherences that can result via the interaction of spoiler gradient moments and imaging gradient moments can be achieved if the condition (2) or (3) is satisfied for at least one of the three orthogonal spatial directions. This means that the spoiler gradient moments can be selected so that at least one of the following conditions is alternately satisfied:

$$|(\Sigma_{i=1 \ldots N} f_i \cdot M_i^{PE}) + (\Sigma_{j=1 \ldots K} g_j \cdot M_B^{PE})| \geq M_S^{PE} \text{ and/or} \quad (2a)$$

$$|(\Sigma_{i=1 \ldots N} f_i \cdot M_i^{RO}) + (\Sigma_{j=1 \ldots K} g_j \cdot M_B^{RO})| \geq M_S^{RO} \text{ and/or} \quad (2b)$$

$$|(\Sigma_{i=1 \ldots N} f_i \cdot M_i^{SL}) + (\Sigma_{j=1 \ldots K} g_j \cdot M_B^{SL})| \geq M_S^{SL}. \quad (2c)$$

This accordingly applies to the condition according to Equation (3).

The spoiler gradient moments can be selected so that the condition of Equation (2) or Equation (3) is satisfied for more than one of the three orthogonal spatial directions, for example for two or three of the spatial directions.

In Equations (1), (1a)-(1c), (2), (2a)-(2c) and (3), N is a whole number that is greater than 1. The index i does not necessarily need to designate the position of the preparation module in the series of preparation modules. Rather, the determined N different spoiler gradient moments are arbitrarily assigned to those preparation modules in which a spoiler gradient field is generated.

In Equations (1), (1a)-(1c), (2), (2a)-(2c) and (3), the index i does not need to run across all preparation modules of the readout sequence. It is sufficient that the corresponding conditions for preparation modules are satisfied that are satisfied in a predetermined time period that can depend on the relaxation time $T_1$. Moreover, not all preparation modules must be taken into account in the condition of Equations (1), (1a)-(1c), (2), (2a)-(2c) and (3), for example if two or more preparation modules cannot interact with one another for physical reasons. For example, this is the case if multiple saturation regions are provided that do not overlap, for example as this can be the case given parallel, cuboid regions. In such cases it is sufficient to take only one of the multiple preparation modules into account in the calculation of the spoiler gradient moments—for example according to one of the cited conditions—and to use this determined spoiler gradient moment in the different preparation modules that do not interact with one another. This measure also helps to slow a growth of the necessary gradient moments.

The threshold in Equations (1), (1a)-(1c), (2), (2a)-(2c) and (3) can be determined depending on a dimension of an imaging voxel. For example, the threshold can be established as:

$$M_S^{Dir} = C \cdot 2 \cdot \pi / (\gamma \cdot d^{Dir}) \quad (4)$$

wherein C is a proportionality constant, γ is a gyromagnetic ratio of a seed, and $d^{Dir}$ is an extent of an imaging voxel in the corresponding direction Dir. Dir can be the phase coding direction (PE), the frequency coding direction (RO) or the slice selection coding direction (SL). The constant C can be set equal to 1, for example, so that $$M_S^{Dir} = 2 \cdot \pi / (\gamma \cdot d^{Dir}), \quad (5)$$

Other suitable values C>0 and in particular C>1 can be selected. Via the selection of the threshold depending on the extent of the imaging voxel in the corresponding direction, it can be taken into account that larger gradient moments are required for a small extent in the corresponding direction in order to achieve a dephasing of 2·π within the imaging voxel.

In the event that gradient pulses that are not used for gradient spoiler are used in one or more preparation modules, these can be respectively rephased. An interference of the gradient moments of these gradient pulses with the spoiler gradient moments that could lead to unwanted coherence paths can thus be reduced or prevented.

The maximum amplitude of spoiler gradient moments can be limited. The limitation can take place specific to the axis. In this way it can be prevented that values of spoiler gradient moments are established that technically cannot be realized, or that can only be realized with severe limitations in the chronological progression of the measurement sequence. In the event that the number of preparation modules in which a spoiler gradient field is applied is greater than the number of spoiler gradient moments that can be achieved under consideration of the limitation of the maximum magnitude, the determined spoiler gradient moments that satisfy the threshold condition can be applied cyclically, for example.

The established spoiler gradient moments can be assigned to the different preparation modules in different orders. For example, an assignment of spoiler gradient moments to preparation modules can take place so that a vector magnitude of a vector that includes the corresponding spoiler gradient moments for the three orthogonal spatial directions as vector components decreases or increases monotonically. An assignment can also take place so that a maximum amplitude of spoiler gradient moments is applied in the last preparation module before an imaging module.

The polarity of the determined spoiler gradient moments can be selected arbitrarily. The polarities can be selected so that all spoiler gradient moments lie in a half-plane or a half-space. Primary signal coherence paths can be strongly suppressed in this way.

In addition to the gradient spoiling, an RF spoiling can be used. For this the phase position of the RF pulse that is radiated in different preparation modules of an imaging sequence can be selected so that the phase position is respectively different for successive preparation modules. A suitable incrementing can be chosen, for example a quadratically incremented RF spoiling. Through the combination of gradient spoiling and RF spoiling, a particularly effective suppression of unwanted coherence paths can be achieved.

The above object also is achieved in accordance with the present invention by a non-transitory, computer-readable data storage medium encoded with programming instructions that, when the storage medium is loaded into a control and evaluation computer system of a magnetic resonance apparatus, cause the magnetic resonance apparatus to be operated according to one or more of the exemplary embodiments of the invented method described above. The instructions can be in the form of source code or a compiled command sequence.

For example, the data medium can be a CD-ROM, a DVD, a magnetic tape, a flash memory or a USB stick on which the programming instructions are stored as electronically readable control information. When this control information is read from the data medium and executed by a computer of the MR imaging apparatus, the method can be implemented according to the different aspects or embodiments of the computer.

The invention also encompasses an apparatus for magnetic resonance (MR) imaging that includes a receiver device to acquire MR signals in at least one imaging module of an acquisition sequence. The apparatus has a gradient field generation device to generate spoiler gradient fields in multiple preparation modules of the acquisition sequence. The apparatus has a controller coupled with the gradient field generation device. The controller is configured to establish spoiler gradient moments of the spoiler gradient fields so that, for at least one of three orthogonal spatial directions, a weighted sum of the spoiler gradient moments that are applied along this spatial direction satisfies a threshold condition. The controller is configured to control the gradient field generation device in the multiple preparation modules in order to generate the spoiler gradient fields so as to affect a transverse magnetization by generating a spoiler gradient field that is spatially variable in one direction in one preparation module, and a spoiler gradient field is generated that is spatially variable in a direction that is different than the first in an additional preparation module.

The apparatus is configured so that spoiler gradient fields that vary with spatial dependency along different directions are generated in at least two of the preparation modules. The growth of the required spoiler gradient moments of the spoiler gradient fields can be slowed by utilizing the multiple spatial dimensions. By selecting the spoiler gradient moments such that a threshold condition is satisfied for at least one of the three orthogonal spatial directions, unwanted coherence paths can be reliably suppressed and the spoiler gradient moments of the spoiler gradient fields can be systematically selected.

The apparatus is configured to implement the method according to one or more of the exemplary embodiments. The controller can be configured to implement the establishment of the spoiler gradient moments as described in the context of the exemplary embodiments of the method.

The embodiments of the apparatus correspond to the embodiments of the method and their effects described above.

BRIEF DESCRIPTION OF THE DRAWINGS

FIG. 5 shows gradient fields that are generated in different preparation modules given methods and devices according to exemplary embodiments.

FIG. 6 shows gradient fields that are generated in different preparation modules given methods and devices according to exemplary embodiments.

FIG. 7 is a flowchart of an exemplary embodiment of the inventive method.

FIG. 8 is a flowchart of another exemplary embodiment of the inventive method.

FIG. 15 is a flowchart of a further exemplary embodiment of the inventive method.

FIG. 16 is a flowchart of a procedure that is usable in the method of FIG. 15.

FIG. 19 shows an image acquired with a conventional MR method in comparison with an image that was acquired with an exemplary embodiment of the inventive method.

DESCRIPTION OF THE PREFERRED EMBODIMENTS

Figure 1:
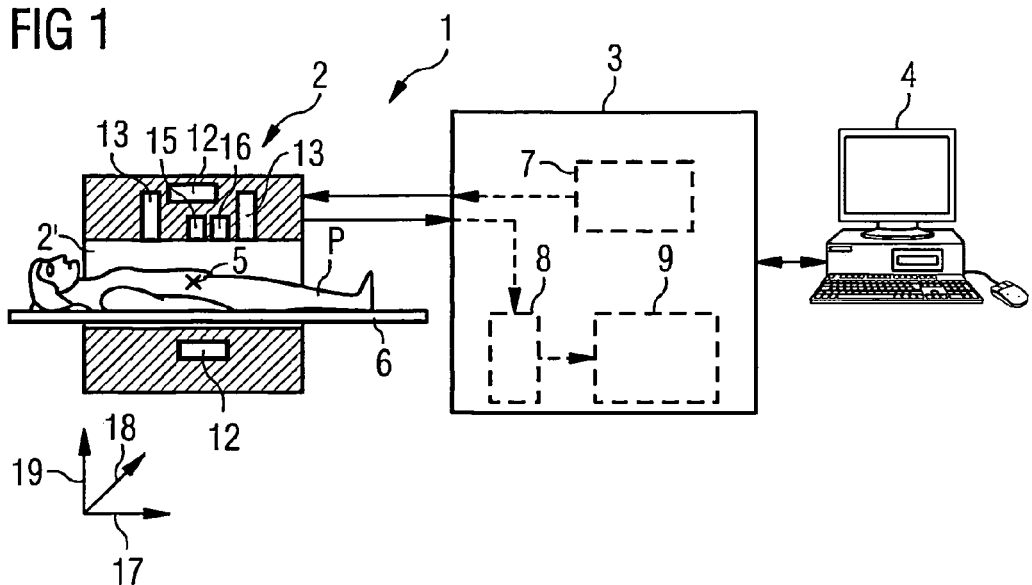
FIG. 1 schematically illustrates an apparatus for MR imaging according to an exemplary embodiment of the invention.

FIG. 1 is a schematic representation of an apparatus 1 for MR imaging. The apparatus 1 includes a data acquisition unit 2, commonly called a scanner. An examination subject P can be driven into a hollow space 2a of the scanner 2. A region of interest of the examination subject P can be positioned at an isocenter 5 via suitable positioning of a support device 6. The scanner 2 has multiple coil components/systems in order to generate a basic magnetic field (BO field) to align nuclear spins in the patient P, gradient fields, and radio-frequency (RF) pulses. The operation of the scanner 2 is controlled by a computer 3. The computer 3 can include a controller 7, an acquisition unit 8 to receive spin signals acquired with reception coils, and an evaluation computer 9 to process the acquired spin signals. A suitable user interface or an additional computer 4 can be provided in order to control the operation of the scanner 2 and/or to further process acquired data.

In addition to an arrangement to generate the basic magnetic field, the scanner 2 has one or more components 12, 13 to generate the aforementioned gradient fields. The components 12, 13 to generate gradient fields can be gradient coils. The components 12, 13 to generate gradient fields can be designed so that gradient fields can be generated that are spatially variable along three orthogonal spatial directions 17, 18, 19.

The scanner 2 also has an RF transmission device 15—for example a coil or coil array—to generate an RF pulse with which nuclear spins aligned in the basic field can be deflected (flipped) from their aligned orientation. An RF reception device 16 (for example a coil or coil array) acquires magnetization signals and provides these signals to the acquisition unit 8.

MR data acquisition takes place with an acquisition sequence, for which the various units of the scanner 2 are controlled by the controller 7. A preparation of the magnetization of the nuclear spins takes place in multiple preparation modules of the acquisition sequence. MR signals are acquired in at least one imaging module of the sequence. Various acquisition sequences can be used, for example saturation methods, contrast preparation methods or acquisition sequences that use an undersampling of k-space.

Spoiler gradient fields are generated in multiple preparation modules. The purpose of the spoiler gradient fields is to dephase specific nuclear spins so that the corresponding signal is suppressed in the imaging modules. As described in further detail below, in methods and devices according to exemplary embodiments spoiler gradient fields are switched (activated) so that spoiler gradient fields generated in multiple different preparation modules spatially vary along different spatial directions. The spoiler gradient moments of the spoiler gradient fields are selected so that they satisfy a predetermined criterion so that no unwanted coherence paths can occur. The spoiler gradient moments of the spoiler gradient fields are selected so that they are incommensurable in the sense that, for at least one of the three spatial directions, a weighted summation of the spoiler gradient moments with defined weighting coefficients that are applied along this spatial direction is not less than a threshold.

Figure 2:
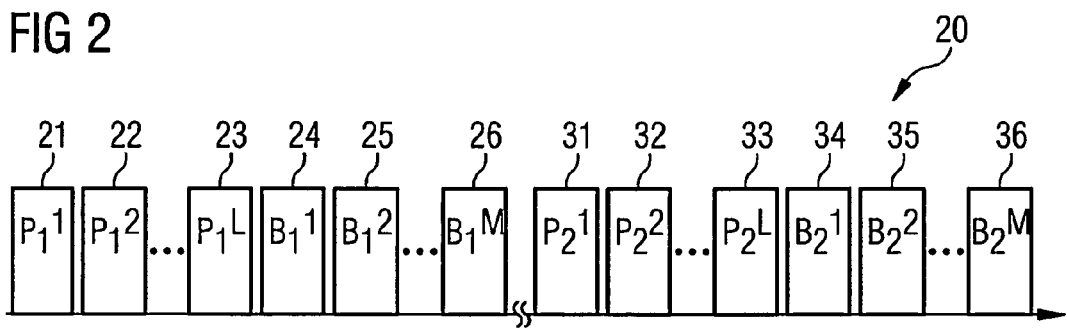
FIG. 2 is a schematic representation of an acquisition sequence according to the invention.

FIG. 2 is a schematic representation of an acquisition sequence 20 that can be implemented by the apparatus 1.

The acquisition sequence 20 has a series of L preparation modules 21-23 and a series of M imaging modules 24-26. Such a sequence can be repeated with preparation modules 31-33 and imaging modules 34-36, for example in order to image additional slices of the examination subject or to acquired additional k-space lines. The number L of preparation modules and/or the number M of imaging modules can be different in the respective repetitions.

Depending on the imaging method that is used, the effect of the preparation modules in the generation of a defined longitudinal magnetization can be along the basic field, for example for the contrast preparation, or in the suppression of the longitudinal magnetization. Such a suppression can be chemically or regionally specific. For example, signals of specific regions of the examination subject P or of specific spin types can be suppressed in this way. For example, each of the preparation modules can include a regional saturation, a chemical shift saturation, or a contrast preparation.

A gradient spoiling is implemented in multiple preparation modules 21-23 and 31-33. Spoiler gradient fields are switched for this. These have the task of affecting the simultaneously generated transversal magnetization portions (transverse to the basic field) and longitudinal magnetization portions (parallel to the basic field) in order to suppress the corresponding signal in the imaging modules.

In sequences in which gradient fields are switched and RF pulses are radiated, this can lead to new, unwanted coherences. For imaging modules, this is explained in a semi-classical treatment in K. Scheffler's "A Pictorial Description of Steady-States in Rapid Magnetic Resonance Imaging", Concepts in Magnetic Resonance 11, 291-304 (1999), for example. Such unwanted coherences can be ascribed to the fact that an RF pulse can lead to an excitation of longitudinal magnetization, to a refocusing, to a further dephasing or to a storage of coherences.

Similar effects can occur given conventional gradient spoiling. For example, the switching of identical spoiler gradient moments in different preparation modules (possibly in combination with one or more RF pulses) can lead to the situation that spins are rephased that should actually be dephased via the gradient spoiling.

A suppression of spins of a species in a defined imaging voxel can be achieved if the spins within this imaging voxel have a sufficiently large phase dispersion in an imaging module. For example, a linear phase dispersion by $2 \cdot \pi$ within the imaging volume can be viewed as sufficient.

In order to achieve such a phase dispersion in an imaging voxel with an extent $d^{PE}$ in the phase coding direction, an extent $d^{RO}$ in the frequency coding direction and an extent $d^{SL}$ in the slice selection direction, an effective spoiler gradient moment of $$M_S^{Dir} = 2 \cdot \pi / (\gamma \cdot d^{Dir}), \quad (5)$$

is required, wherein Dir $\in$ {PE; RO; SL} specifies a direction.

In exemplary embodiments of the invention, spoiler gradient fields are switched in multiple different directions. For example, a spoiler gradient field that is spatially variable along the phase coding direction can be switched in one preparation module, and a spoiler gradient field that is spatially variable along the frequency coding direction or the slice selection direction can be switched in an additional preparation module. A spoiler gradient field that is spatially variable along the phase coding direction and a spoiler gradient field that is spatially variable along the frequency coding direction can also be switched simultaneously in a preparation module.

Figure 3:
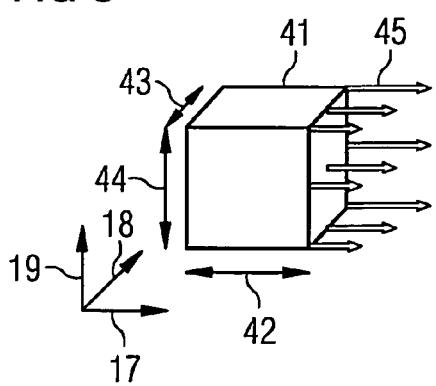
FIG. 3 and FIG. 4 show gradient fields that are generated in different preparation modules given methods and devices according to exemplary embodiments.
Figure 4:
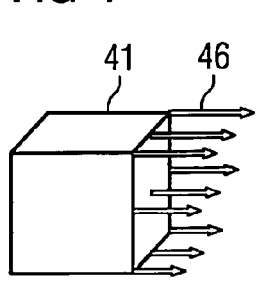

FIGS. 3 and 4 illustrate spoiler gradient fields 45 and 46 that are switched during different preparation modules of the readout sequence. The spoiler gradient fields 45, 46 permeate an imaging voxel 41 that has dimensions 42-44 in three orthogonal spatial directions. The spoiler gradient field 45 varies along the spatial direction 18. The spoiler gradient field 45 varies along the spatial direction 19. The direction of the magnetic field of the spoiler gradient fields that are generated in different preparation modules can be parallel to the direction of the basic field, for example.

In order to ensure a desired phase dispersion after the preparation modules, the spoiler gradient moments are selected so that a weighted sum of the spoiler gradient moments for at least one spatial direction has an absolute value that is at least equal to a threshold that is associated with this spatial direction. The time integral over the magnetic field gradients of the spoiler gradient field is hereby conventionally designated as a spoiler gradient moment. For a constant spoiler gradient field, the spoiler gradient moment would be given by (for example) the product of magnetic field gradient and time duration during which the spoiler gradient field is generated in the corresponding preparation module.

The spoiler gradient moments are established so that at least one of the following conditions is satisfied:

$$|\Sigma_{i=1 \ldots N} f_i \cdot M_i^{PE}| \geq M_S^{PE} \text{ and/or} \quad (1a)$$

$$|\Sigma_{i=1 \ldots N} f_i \cdot M_i^{RO}| \geq M_S^{R} \text{ and/or} \quad (1b)$$

$$|\Sigma_{i=1 \ldots N} f_i \cdot M_i^{SL}| \geq M_S^{SL}. \quad (1c)$$

The thresholds on the right side of the Equations (1a)-(1c) can be selected according to Equation (5) or Equation (4) and do not all need to be identical. $M_i^{PE}$ designates a spoiler gradient moment of a spoiler gradient field (that is spatially variable in the phase coding direction) in a preparation module designated with index i. $M_i^{RO}$ is a spoiler gradient moment of a spoiler gradient field (that is spatially variable in the frequency coding direction) in a preparation module designated with i. $M_i^{SL}$ is a spoiler gradient moment of a spoiler gradient field (that is spatially variable in the slice selection direction) in a preparation module designated with i. If no spoiler gradient field is applied in a preparation module in the corresponding direction, the corresponding spoiler gradient moment is equal to zero.

The summation in equations (1a)-(1c) spans all relevant preparation modules, i.e. it is formed over all preparation modules in which a spoiler gradient field is generated and that lie within a time interval defined by the relaxation time $T_1$. For example, the corresponding time interval can have a duration of $3 \cdot T_1$ before the first imaging module. The number N of preparation modules that are taken into account in the weighted summation is greater than 1. The index i in Equations (1a)-(1c) need not necessarily to reflect the actual position of the preparation module in the series of preparation modules. For example, the spoiler gradient moments that are established so that they respectively satisfy at least one of the Equations (1a)-(1c) can subsequently be assigned in an arbitrary order to the different preparation modules in which spoiler gradient fields should be generated.

The weighting factors $f_i$ in Equations (1a)-(1c) are respectively selected from the group $\{-1; 0; 1\}$. The spoiler gradient moments can be selected so that at least one of the three Equations (1a)-(1c) is respectively satisfied for each set of coefficients of the weighted sum $\{f_1, f_2, \ldots, f_N\}$ in which not all coefficients are equal to 0. For different sets of coefficients $\{f_1, f_2, \ldots, f_N\}$ in which not all coefficients are equal to 0, different individual conditions of (1a)-(1c) can be satisfied. For example, Equation (1a) can be satisfied for one set of coefficients while Equation (1b) or (1c) is satisfied for a different set of coefficients.

If the spoiler gradient moments are selected so that respectively at least one of the three Equations (1a)-(1c) is satisfied for each set of coefficients of the weighted sum $\{f_1, f_2, \ldots, f_N\}$ in which the coefficients are respectively selected from $\{-1; 0; 1\}$ and not all coefficients are equal to 0, a sufficient phase dispersion can be achieved in spite of the complex interaction between spoiler gradient fields and RF pulses. A sufficient phase dispersion in an imaging voxel then exists independent of whether an RF pulse leads to an excitation, a refocusing, a further dephasing or a storage of coherences. A sufficient phase dispersion can thus be achieved independent of whether—in the notation of K. Scheffler, "A Pictorial Description of Steady-States in Rapid Magnetic Resonance Imaging", Concepts in Magnetic Resonance 11, 291-304 (1999)—an RF pulse produces a transition from the state $Z_0$ into the state $F_0^+$ (excitation); a transition from the state $Z_n/F_n$ into the state $F^*_{-n}$ (refocusing); a transition from the state $Z_n/F^*_{-n}$ into the state $F_n^+$ (further dephasing); or a transition from the state $F_n/F^*_{-n}$ into the state $Z_n^+$ (storage).

In the conditions of Equations (1a)-(1c), the three spatial axes PE, RO and SL or, respectively, the corresponding spoiler gradient moments are defined identically in the different preparation modules. This even applies when different coordinate system [sic] are used in individual preparation modules. Effective gradient spoiling across multiple preparation modules can thereby be achieved. The spatial axes can be defined by the imaging module in which a corresponding coding and data acquisition takes place.

The selection of spoiler gradient moments according to the conditions of Equations (1a)-(1c) is explained in detail with reference to FIG. 5 and FIG. 6.

FIG. 5 shows a representation of spoiler gradient fields 51 along the three spatial directions. The preparation modules are implemented sequentially in time intervals 52-57. A spoiler gradient field in the PE direction is switched in the time interval 52. The gradient is established so that the spoiler gradient moment is equal to $M_S^{PE}$, wherein $M_S^{PE}$ can be defined as indicated in Equation (4) or Equation (5). The time integral 47 of the spoiler gradient field is thus equal to the threshold $M_S^{PE}$. A spoiler gradient field is switched in the RO-direction in the time interval 53. The gradient is established so that the spoiler gradient moment is equal to $M_S^{RO}$, wherein $M_S^{RO}$ can be defined as indicated in Equation (4) or Equation (5). A spoiler gradient field in the SL-direction is switched in the time interval 54. The gradient is established so that the spoiler gradient moment is equal to $M_S^{SL}$, wherein $M_S^{SL}$ can be defined as indicated in Equation (4) or Equation (5). The time integral 48 of the spoiler gradient field is thus equal to the threshold $M_S^{SL}$. As is schematically shown, at least two of $M_S^{PE}$, $M_S^{RO}$ and $M_S^{SL}$ are different, for example when the imaging voxel is not cuboid. A spoiler gradient field in the PE-direction is switched in the time interval 55. The gradient is established so that the spoiler gradient moment is equal to $2 \cdot M_S^{RE}$. A spoiler gradient field in the RO-direction is switched in the time interval 56. The gradient is established so that the spoiler gradient moment is equal to $2 \cdot M_S^{RO}$. A spoiler gradient field in the SL-direction is switched in the time interval 57. The gradient is established so that the spoiler gradient moment is equal to $2 \cdot M_S^{SL}$. The selection of a direction and doubling of the spoiler gradient moment in comparison to the previous maximum of the preceding spoiler gradient moments for this direction can be repeated. By the generation of such a geometric series but with spoiler gradient fields, it is ensured that all three of the conditions (1a)-(1c) are satisfied for each set of coefficients. An excessively strong growth of the required spoiler gradient moments can be prevented via the switching of spoiler gradient fields in different spatial directions.

FIG. 6 shows a representation of spoiler gradient fields 59 along the three spatial directions. The preparation modules are implemented sequentially in time intervals 52-54. A spoiler gradient field in the PE-direction is switched in the time interval 52. The gradient is established so that the spoiler gradient moment is equal to $-M_S^{PE}$, wherein $M_S^{PE}$ can be defined as indicated in Equation (4) or Equation (5). A spoiler gradient field in the RO-direction is switched in the same time interval 52. The gradient is established so that the spoiler gradient moment is equal to $M_S^{RO}$, wherein $M_S^{RO}$ can be defined as indicated in Equation (4) or Equation (5).

A spoiler gradient field in the PE-direction is switched in the time interval 53. The gradient is established so that the spoiler gradient moment is equal to $-M_S^{PE}$. A spoiler gradient field in the RO-direction is switched in the same time interval 53. The gradient is established so that the spoiler gradient moment is equal to $-M_S^{RO}$.

A spoiler gradient field in the PE-direction is switched in the time interval 54. The gradient is established so that the spoiler gradient moment is equal to $-M_S^{PE}$. No spoiler gradient field is switched in the same time interval 54.

In the case of the switched spoiler gradient fields as shown in FIG. 6, spoiler gradient fields are simultaneously switched in different directions. For example, an effective spoiler gradient field results in the time interval 53 that is not spatially variable along one of the spatial directions PE or RO but rather (for example) along a direction defined by the bisecting line between the PE-axis and RO-axis. The required spoiler gradient moments can thus be reduced in terms of their magnitude.

The spoiler gradient moments from FIG. 6 also satisfy the requirement that respectively at least one of the conditions (1a)-(1c) is satisfied for each coefficient tuple $\{f_1, f_2, f_3\}$ in which not all coefficients are equal to 0. For $\{f_1, f_2, f_3\}=\{1, 1, 0\}$, although Equation (1b) is not satisfied, for example, Equation (1a) is. For $\{f_1, f_2, f_3\}=\{1, -1, 0\}$, although Equation (1a) is not satisfied, Equation (1b) is. It is thereby ensured that a sufficient phase dispersion is present in an imaging voxel.

With reference to FIG. 7-14, methods according to exemplary embodiments are described that systematically allow an establishment of the spoiler gradient moments such that unwanted coherence paths are suppressed. For this the spoiler gradient moments are established so that respectively at least one of the three Equations (1a)-(1c) is satisfied, for example for each set of coefficients of the weighted sum $\{f_1, f_2, \ldots, f_N\}$ in which the coefficients are respectively selected from $\{-1; 0; 1\}$ and in which not all coefficients are equal to 0. This is subsequently also designated as an "incommensurability condition"; the corresponding spoiler gradient moments are designated as "incommensurable spoiler gradient moments". Namely, the corresponding spoiler gradient moments directly prevent that the weighted sum can have a value that is less than the phase dispersion desired according to Equation (5). In this sense the selected spoiler gradient moments are incommensurable.

The method embodiments described with reference to FIGS. 7-14 are iterative methods. In these embodiments, a direction is selected along which a spoiler gradient field in one of the preparation modules should vary. The direction can be selected depending on which spoiler gradient moments have already been established for at least two of the spatial directions in preceding iterations of the iterative method. The spoiler gradient moment can thereby be established so that the incommensurability condition is satisfied, but the amplitude of the spoiler gradient moment does not need to be chosen to be unnecessarily large.

FIG. 7 is a flowchart of the method 60 according to an exemplary embodiment. In the method 60, spoiler gradient fields are switched in which the B-field respectively varies spatially along one of the three spatial directions PE, RO, SL. For each of the spatial directions, the sequentially established spoiler gradient moments can respectively form a geometric series. In this way it is ensured that the incommensurability condition is satisfied.

Three multipliers FactorPE, FactorRO and FactorSL that are associated with the three spatial directions are respectively initialized at 61.

An iteration over an index i is initialized at 62.

At 63, in the first iteration the spoiler gradient moment i determined that would be required for the three spatial directions in order to satisfy (1a)-(1c). For this $$M_i^{PE} = \text{FactorPE} \cdot M_S^{PE}, \quad (6a)$$

$$M_i^{RO} = \text{FactorRO} \cdot M_S^{RO}, \quad (6b)$$

$$M_i^{SL} = \text{FactorSL} \cdot M_S^{SL} \quad (6c)$$

are determined. The thresholds $M_S^{PE}$, $M_S^{RO}$ and $M_S^{SL}$ on the right side of Equations (6a)-(6c) can be defined as indicated in Equation (4) or Equation (5).

In the subsequent Steps 64-71 it is determined which of the variables $M_S^{PE}$, $M_S^{RO}$ and $M_S^{SL}$ is the minimum of these three variables. This defines the direction for which the spoiler gradient moment is established in the iteration i and the corresponding absolute value of the spoiler gradient moment. For this, at 64 it can initially be determined whether $M_i^{PE} \leq M_i^{RO}$ and $M_i^{PE} \leq M_i^{SL}$. In the event that this is the case, the method continues at 65. At 65 it is established that the i-th spoiler gradient moment is generated for the PE-direction and is equal to $M_i^{PE}$. At 66, FactorPE is doubled. It is thereby taken into account that a larger spoiler gradient moment for the PE-direction is required in subsequent iterations, for example in order to avoid an unwanted rephasing due to two spoiler gradient moments of identical absolute value for the PE-direction with an RF pulse radiated between them. The method proceeds at 72.

In the event that it is determined at 64 that $M_i^{PE} > M_i^{RO}$ or $M_i^{PE} > M_i^{SL}$, the method continues at 67. At 67 it can be determined whether $M_i^{RO} \leq M_i^{SL}$ and $M_i^{RO} \leq M_i^{PE}$. In the event that this is the case, the method continues at 68. At 68 it is established that the i-th spoiler gradient moment is generated for the RO-direction and is equal to $M_i^{RO}$. At 69, FactorRO is doubled. It is thereby taken into account that a larger spoiler gradient moment for the RO-direction is required in subsequent iterations, for example in order to avoid an unwanted rephasing due to two spoiler gradient moments of identical absolute value for the RO-direction with an RF pulse radiated between them. The method proceeds at 72.

In the event that it is determined at 67 that $M_i^{RO} > M_i^{SL}$ or $M_i^{RO} > M_i^{PE}$, the method continues at 70. At 70 it is established that the i-th spoiler gradient moment is generated for the SL-direction and is equal to $M_i^{SL}$. At 71, FactorSL is doubled. It is thereby taken into account that a larger spoiler gradient moment for the SL-direction is required in subsequent iterations, for example in order to avoid an unwanted rephasing due to two spoiler gradient moments of identical absolute value for the SL-direction with an RF pulse radiated between them. The method proceeds at 72.

At 72 the index i is incremented.

At 73 a check is made as to whether the index i is less than or equal to the number N of preparation modules that lie within the relevant time interval and for which spoiler gradient fields should be generated. In the event that i is less than or equal to the number N of preparation modules, the method returns to 63. The variables $M_i^{PE}$, $M_i^{RO}$ and $M_i^{SL}$ are calculated at 63 according to Equations (6a)-(6c). It is thereby taken into account that one of the factors FactorPE, FactorRO or FactorSL was doubled in the preceding iteration. For that direction for which the spoiler gradient moment was established in the preceding iteration, a spoiler gradient moment that is twice as large would now accordingly need to be established in order to suppress an unwanted rephasing of spins with certainty.

In the event that it is determined at 73 that the index i is greater than the number N of preparation modules, the method proceeds at 74.

At 74 the N spoiler gradient moments established in Steps 71-73 and associated directions are assigned to the different preparation modules. For this the spoiler gradient moments can be reordered arbitrarily. For example, the largest (in terms of absolute value) spoiler gradient moment can also be generated in the first preparation module of the series of preparation modules. Different criteria can be applied for the assignment of spoiler gradient moments and preparation modules. For example, in exemplary embodiments an assignment can take place such that the determined spoiler gradient moments $\vec{M}_i$ are assigned according to their vectorial absolute magnitudes $\|\vec{M}_i\|$ so that they decrease or increase monotonically in the series of preparation modules. The assignment can take place so that the spoiler gradient moment $\vec{M}_i$ with maximum absolute value $\|\vec{M}_i\|$ is applied immediately before the first imaging module.

At 75 the acquisition sequence is implemented with preparation modules and at least one imaging module, wherein the established spoiler gradient moments are used.

While spoiler gradient moments for all three spatial directions PE, RO and SL can be established in the method 60, it is not necessary to use all three spatial directions.

FIG. 8 shows a method 80 according to a further exemplary embodiment. In the method 80, gradient spoiling is implemented with gradient fields that are spatially variable along the PE- or RO-axis. Spoiler gradient fields that are spatially variable along the SL-axis are not used.

The various steps of the method 80 corresponding to the method steps described with reference to FIG. 7, wherein the SL-direction is not used.

In additional variants, two different spatial axes (for example the PE- and SL-direction or the RO- and SL-direction) can be used in order to generate spoiler gradient fields for different directions.

Figure 9:
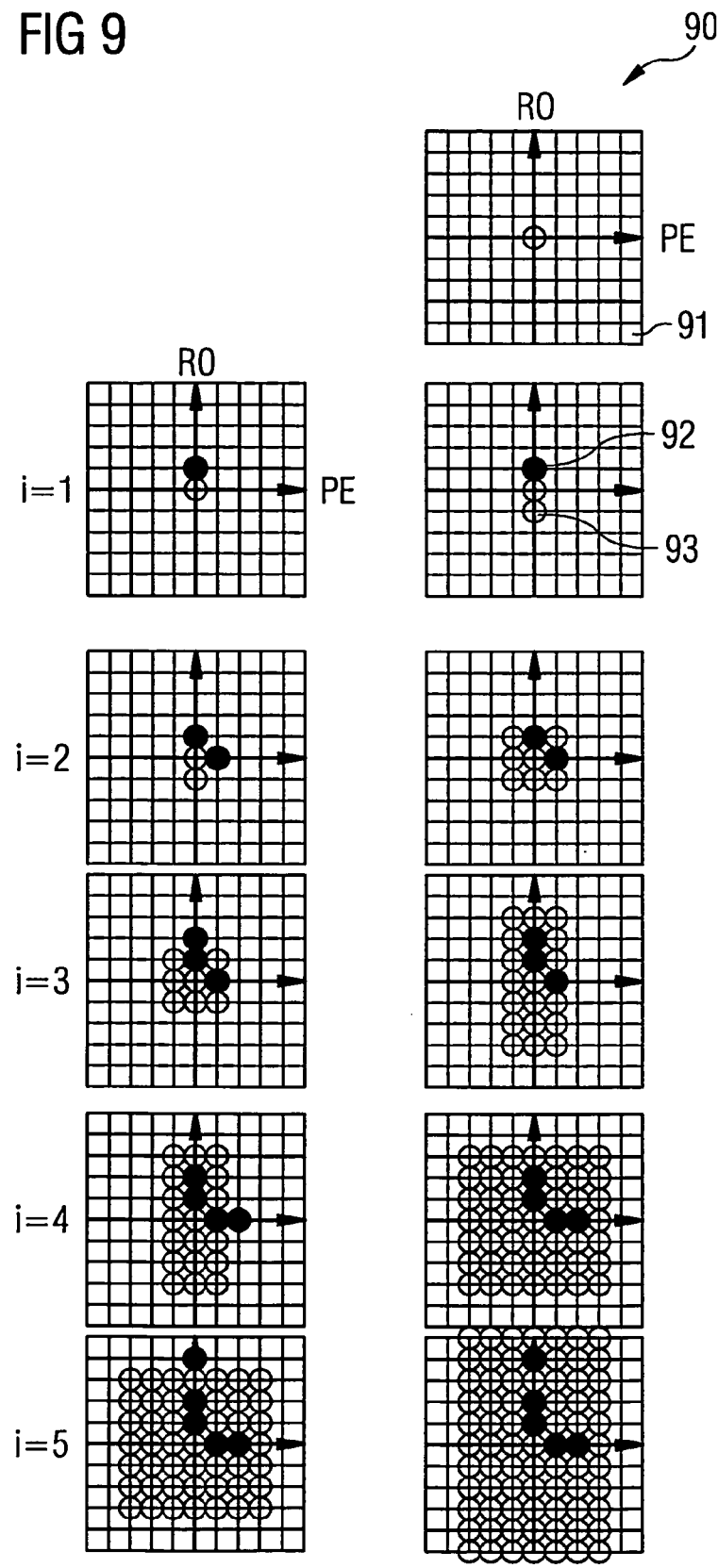
FIG. 9 illustrates the spoiler gradient moments established sequentially in the method of FIG. 8.

FIG. 9 illustrates the selection of spoiler gradient moments for the method from FIG. 7 and the method of FIG. 8. FIG. 9 is a schematic representation of population matrices 90 at different stages during the iterative method. Each of (0, 0) different grid points of the population matrix initially represents a permissible selection of spoiler gradient moments. The spoiler gradient moments are scaled in the PE-direction with $M_S^{PE}$, meaning that a spoiler gradient field placed at the point (1, 0) of the population matrix corresponds to a spoiler gradient moment of $M_S^{PE}$ that is applied along the PE-direction. The spoiler gradient moments in the RO-direction are scaled with $M_S^{RO}$, meaning that a spoiler gradient field placed at the point (0, 1) of the population matrix corresponds to a spoiler gradient moment of $M_S^{RO}$ that is applied along the RO-direction.

Given implementation of the method from FIG. 7 or FIG. 8, the population matrix is filled sequentially. Established spoiler gradient moments $\vec{M}_i$ are identified with filled circles. The selection of a spoiler gradient moment $\vec{M}_i$ in the i-th iteration leads to the situation that not only this spoiler gradient moment but also other spoiler gradient moments (for example $-\vec{M}_i$) in the subsequent iterations can no longer be selected since this would impair the incommensurability condition. Such spoiler gradient moments are "forbidden" in subsequent iterations in the sense that none of the three Equations (1a)-(1c) would be satisfied for at least one N-tuple of coefficients $\{f_1, f_2, \ldots, f_N\}$. This would negatively affect the reliability of the signal suppression. Such forbidden spoiler gradient moments are represented with open circles.

All spoiler gradient moments different than (0, 0) can be chosen in the first iteration, as is represented by the population matrix 91.

In the first iteration (i=1), in particular an optimally small spoiler gradient moment can be selected. For example, a spoiler gradient moment $(0, M_S^{RO})$ can be selected in the event that $M_S^{PE}$ is greater than $M_S^{RO}$). This is depicted in the left column of FIG. 9. After selecting the spoiler gradient moment $(0, M_S^{RO})$ for i=1, in addition to the populated field 92 (solid circle) the field 93 which corresponds to the spoiler gradient moment $-(0, M_S^{RO})$ is also forbidden since it would lead to a violation of the incommensurability condition.

For example, in the second iteration (i=2) a spoiler gradient moment $(M_S^{PE}, 0)$ can be selected in the event that $M_S^{PE}$ is less than $2 \cdot M_S^{RO}$. The spoiler gradient moments $(M_S^{PE}, M_S^{RO})$, $(M_S^{PE}, -M_S^{RO})$, $(-M_S^{PE}, M_S^{RO})$, $(-M_S^{PE}, 0)$ and $(-M_S^{PE}, -M_S^{RO})$ accordingly now also become "forbidden" fields. The method is continued accordingly in the subsequent iterations i=3, 4, 5 as described with reference to FIGS. 7 and 8.

By utilizing the different spatial directions, the growth of the spoiler gradient moments with the number of preparation modules can be slowed. For example, the spoiler gradient moments for nine preparation modules and three available spatial directions can be selected as follows, wherein the incommensurability condition remains satisfied:

$(M_S^{PE}; 0; 0)$
$(0; M_S^{RO}; 0)$
$(0; 0; M_S^{SL})$
$(2 \cdot M_S^{PE}; 0; 0)$
$(0; 2 \cdot M_S^{RO}; 0)$
$(0; 0; 2 \cdot M_S^{SL})$
$(4 \cdot M_S^{PE}; 0; 0)$
$(0; 4 \cdot M_S^{RO}; 0)$
$(0; 0; 4 \cdot M_S^{SL})$ In the event that spoiler gradient moments have been applied in one of the spatial directions, to preserve the incommensurability condition against these corresponding spoiler gradient moments would be required that would grow up to 256 times one of the thresholds $M_S^{PE}$, $M_S^{RO}$ or $M_S^{SL}$. The requirements for the amplitude of the necessary spoiler gradient moment are reduced via the independent consideration of the different spatial directions according to the condition of Equation (1a)-(1c).

A method as it has been described with reference to FIGS. 7-9 allows the establishment of spoiler gradient moments even in cases in which the extent of the imaging voxel in all three spatial directions is not identical. The different extents, and the differences in $M_S^{PE}$, $M_S^{RO}$ and $M_S^{SL}$ that follow therefrom, can be used in the method of FIG. 7-9 in order to keep the maximum amplitude of the required spoiler gradient moments as low as possible.

If it is allowed that spoiler gradient moments are generated simultaneously along multiple spatial axes in a preparation module, in numerous cases the maximum required spoiler gradient moments can be further reduced in terms of absolute value. For example, in a case in which spoiler gradient moments are generated along the PE-direction and along the RO-direction, the following spoiler gradient moments also satisfy the incommensurability condition:

$(-M_S^{PE}; M_S^{RO})$
$(-M_S^{PE}; -M_S^{RO})$
$(-M_S^{PE}; 0)$

For each axis, only one spoiler gradient moment of $M_S^{PE}$ or $M_S^{RO}$ is thus required in terms of magnitude. The method of FIGS. 7-9 would lead to a maximum spoiler gradient moment of $2 \cdot M_S^{PE}$ or $2 \cdot M_S^{RO}$.

Various methods can be used in order to systematically establish the spoiler gradient moments in a case in which simultaneous spoiler gradient moments might be generated along multiple spatial axes. A method according to an exemplary embodiment is described in detail with reference to FIGS. 10 and 11.

Figure 10:
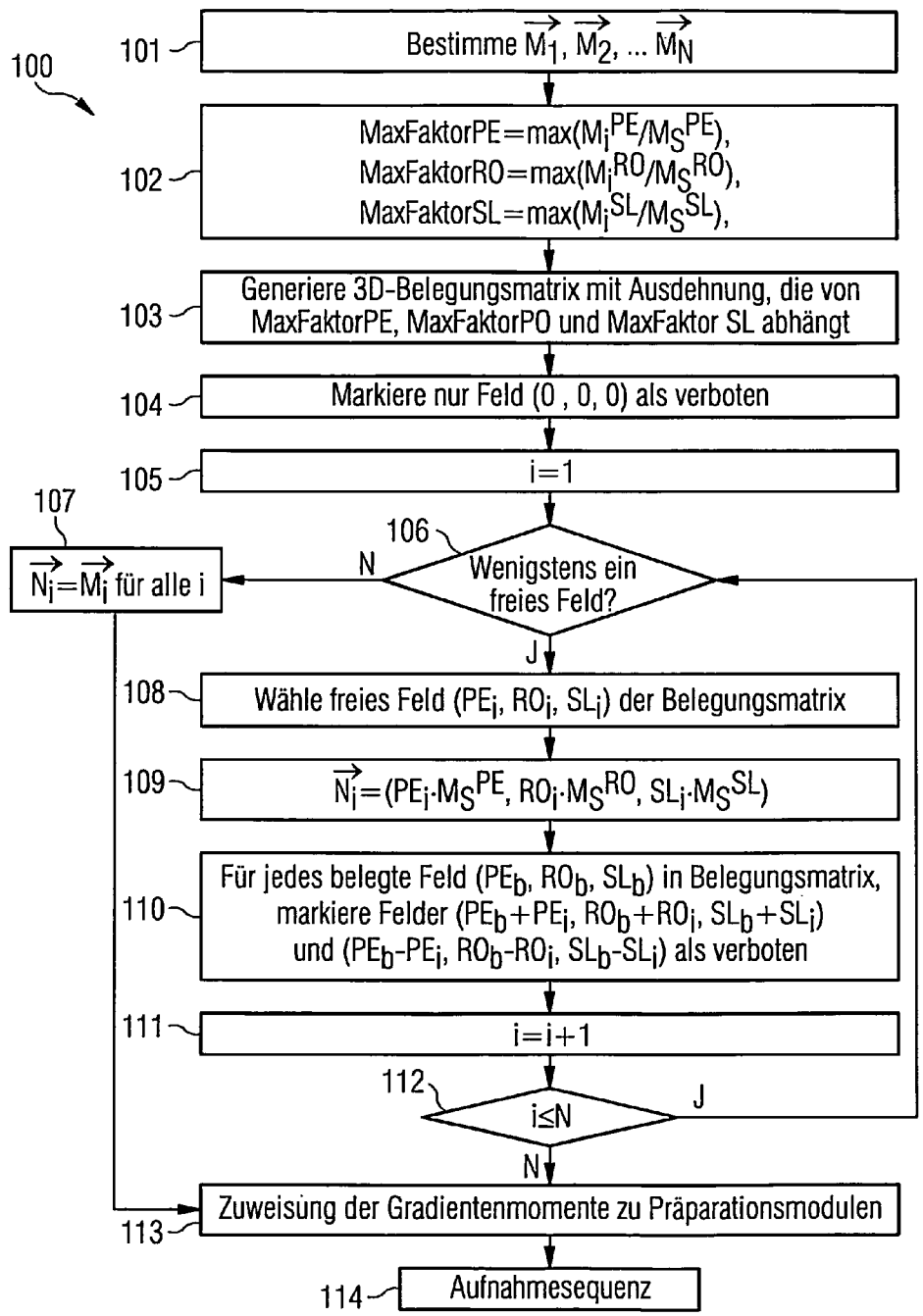
FIG. 10 is a flowchart of a further exemplary embodiment of the inventive method.

FIG. 10 shows a flowchart of a method 100 according to one exemplary embodiment. In the method, an establishment of spoiler gradient moments for preparation modules takes place via sequential filling of a population matrix.

At 101, spoiler gradient moments $\vec{M}_i$ are determined with Steps 61-72 of the method 60 from FIG. 7, wherein $1 \le i \le N$.

At 102, a size of a population matrix is determined depending on the spoiler gradient moments that are determined in such a manner. For this purpose, the variables MaxFactorPE, MaxFactorRO and MaxFactorSL are calculated according to the following equations:

$$\text{MaxFactorPE} = \max_{i=1 \ldots N}(M_i^{PE}/M_S^{PE}), \tag{7a}$$

$$\text{MaxFactorRO} = \max_{i=1 \ldots N}(M_i^{RO}/M_S^{RO}), \tag{7b}$$

$$\text{MaxFactorSL} = \max_{i=1 \ldots N}(M_i^{SL}/M_S^{SL}). \tag{7c}$$

These variables provide the maximum moment required in the corresponding direction, measured in units of the threshold associated with this direction according to Equation (4) or (5).

At 103 a 3D population matrix is generated whose dimensions depend on the variables MaxFactorPE, MaxFactorRO and MaxFactorSL determined at 102. For example, the population matrix can be generated so that it has the discrete points (−MaxFactorPE, −MaxFactorPE +1, . . . , 0, 1, . . . , MaxFactorPE−1, MaxFactorPE) in the PE-direction; the discrete points (−MaxFactorRO, −MaxFactorRO +1, . . . , 0, 1, . . . , MaxFactorRO−1, MaxFactorRO) in the RO-direction; and the discrete points (−MaxFactorSL, −MaxFactorSL +1, . . . , 0, 1, . . . , MaxFactorSL−1, MaxFactorSL) in the SL-direction. An example of a population matrix is described with reference to FIG. 11.

At 104 the field (0, 0, 0) is marked as a forbidden field.

At 105 an iteration is initialized over an index i.

At 106 a check is made as to whether the population matrix has at least one free field. In the event that this is not the case, the method continues at 107. At 107 the spoiler gradient moments $\vec{M}_i$ determined at 101 are used. For this the spoiler gradient moments $\vec{N}_i = \vec{M}_i$ established in the method 100 can be set. The method continues at 113.

In the event that it is determined at 106 that the population matrix has at least one free field, the method proceeds at 108. At 108 a free field of the population matrix is selected with the coordinates ($PE_i$, $RO_i$, $SL_i$). At least two of the three coordinates can thereby be different than zero.

At 109 the vector $\vec{N}_i$ of spoiler gradient moments that is established in this iteration is defined as $$\vec{N}_i = (PE_i \cdot M_S^{PE}, RO_i \cdot M_S^{RO}, SL_i \cdot M_S^{SL}). \quad (8)$$

At 110 all fields of the population matrix that can lead to a violation of the incommensurability condition in interaction with the vector $\vec{N}_i$ of spoiler gradient moments that is established at 109 are marked as forbidden. For this purpose, the field ($PE_b + PE_i$, $RO_b + RO_i$, $SL_b + SL_i$) and the field ($PE_b + PE_i$, $RO_b + RO_i$, $SL_b + SL_i$) are marked as forbidden for each populated field of the population matrix with the coordinates ($PE_b$, $RO_b$, $SL_b$).

The index i is incremented at 111.

At 112 a check is made as to whether i is less than or equal to N. In the event that is determined that i is less than or equal to N, the method returns to 106. Otherwise, the method continues at 113.

At 113 the determined spoiler gradient moments are assigned to the different preparation modules. This can take place as described for Step 74 of the method 60.

At 114 the acquisition sequence is implemented, wherein spoiler gradient moments according to the established vectors $\vec{N}_i$ of spoiler gradient moments are switched in the preparation modules.

The method of FIG. 10 can be modified accordingly for the case in which spoiler gradient fields should be switched only along two spatial directions. For example, for this the size of the population matrix can be set to zero in the corresponding direction (for example MaxFactorSL) in Step 102.

In principle, in the method every free field (i.e. every unpopulated and not otherwise forbidden field) of the population matrix can be selected in Step 108. The method can be expanded by an additional loop in which Steps 102-112 are repeated for multiple different spoiler gradient moments selected at 108. The respective resulting spoiler gradient moments $\vec{N}_i$ can be stored. Among the multiple solutions, one can be selected that has the smallest maximum amplitudes of the spoiler gradient moments.

Figure 11:
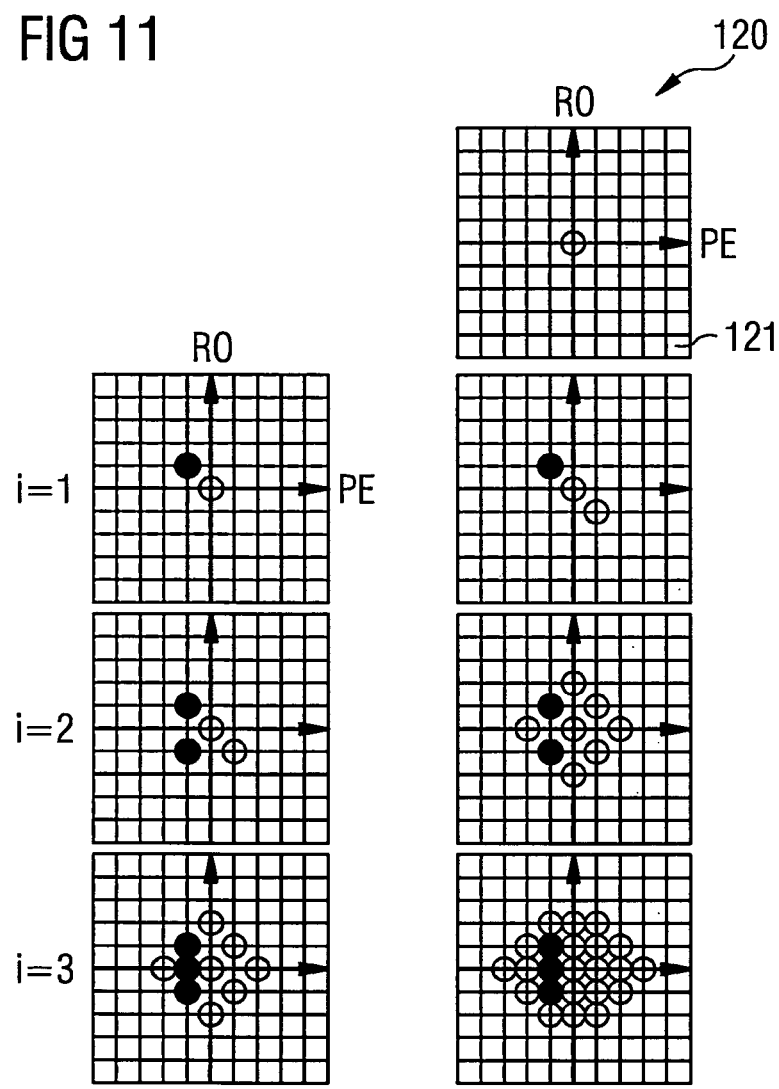
FIG. 11 illustrates the spoiler gradient moments established sequentially in the method of FIG. 10.

FIG. 11 illustrates the method of FIG. 10 in the event that spoiler gradient moments are switched along the RO-axis and the SL-axis. FIG. 11 is a schematic representation of population matrices 120 at different stages during the iterative method. Each grid point of the population matrix that differs from (0, 0) initially represents a permissible selection of spoiler gradient moments as represented by the initial population matrix 121.

In the first iteration i=1, an arbitrary free field can be selected. A field is appropriately selected that is removed from the center of the population matrix by less than a threshold. For example, a field (−1, 1) can be selected that corresponds to a spoiler gradient moment ($-M_S^{PE}$, $M_S^{RO}$).

As shown in the right column of FIG. 11, this leads to the situation that the field (0−(−1), 0−1)=(1,−1) is also forbidden in addition to the populated field (−1, 1). The method continues with the selection of an additional free field in the next iteration. According to Step 110 of the method of FIG. 10, fields that would lead to a violation of the incommensurability condition are marked as forbidden.

In the method as it was described in detail with reference to FIGS. 7-11, to suppress unwanted signal contributions it is ensured that the incommensurability condition according to Equations (1a)-(1c) is satisfied.

However, in the event that multiple imaging modules are used—for example given steady state methods such as PSIF or FISP methods, or given multi-gradient echoes such as MPRAGE—new coherence paths can also be generated in the imaging modules. Under the specific circumstances, signal coherences with different history can contribute to the acquired signal again. This can be the case for unwanted signal contributions from the preparation modules that can be rephased again via a series of imaging modules. In order to avoid this, the spoiler gradient moments can be selected depending on the imaging gradient moments that are applied in the imaging modules.

Given the use of multiple imaging modules to avoid ghosting artifacts in each imaging module, a defined, constant imaging gradient moment $$\vec{M}_B = (M_B^{PE}, M_B^{RO}, M_B^{SL}) \quad (9)$$

is frequently used.

In order to avoid unwanted signal coherence paths between the preparation modules and multiple imaging modules, the spoiler gradient moments can be selected depending on the imaging gradient moment $\vec{M}_B$.

For this purpose, conditions similar to Equations (1a)-(1c) can be established, but that take into account the additional spin dynamics in the imaging modules. For example, the spoiler gradient moments for the preparation modules can be established so that at least one of the following conditions:

$$|(\Sigma i=1 \ldots N f_i \cdot MiPE) + (\Sigma j=1 \ldots K g_j \cdot MBPE)| \geq MSPE \text{ and/or} \quad (2a)$$

$$|(\Sigma i=1 \ldots N f_i \cdot MiRO) + (\Sigma j=1 \ldots K g_j \cdot MBRO)| \geq MSRO \text{ and/or} \quad (2b)$$

$$|(\Sigma i=1 \ldots N f_i \cdot MiSL) + (\Sigma j=1 \ldots K g_j \cdot MBSL)| \geq MSSL. \quad (2c)$$

is satisfied for each $N^{th}$ set of coefficients $\{f_1, f_2, \ldots, f_N\}$ that is not equal to $\{0, 0, \ldots, 0\}$ and in which each coefficient $f_i$ (with $1 \leq i \leq N$) is selected from a group $\{-1; 0; 1\}$, wherein N designates a number of preparation modules, and for each K-tuple of coefficients $\{g_1, g_2, \ldots, g_K\}$ in which each coefficient $g_j$ (with $1 \leq j \leq K$) is selected from a group $\{-1; 0; 1\}$, wherein K designates a number of imaging modules.

The sums i and j thereby run over preparation and imaging modules that lie within a time interval (for example with the length 3·T1) defined by the relaxation time T1 of the corresponding spin species. In Equations (2a)-(2c), the coefficients $g_j$ can also all be equal to 0. This means that at least one of the Equations (2a)-(2c) must also be satisfied for $\{g_1, g_2, \ldots, g_K\} = \{0, 0, \ldots, 0\}$.

Methods with which a corresponding selection of spoiler gradient moments can be executed systematically are described in detail with reference to FIGS. 12-14. For example, such methods can be based on the methods described with reference to FIGS. 7-9, or on the method described with reference to FIGS. 10 and 11.

Figure 12:
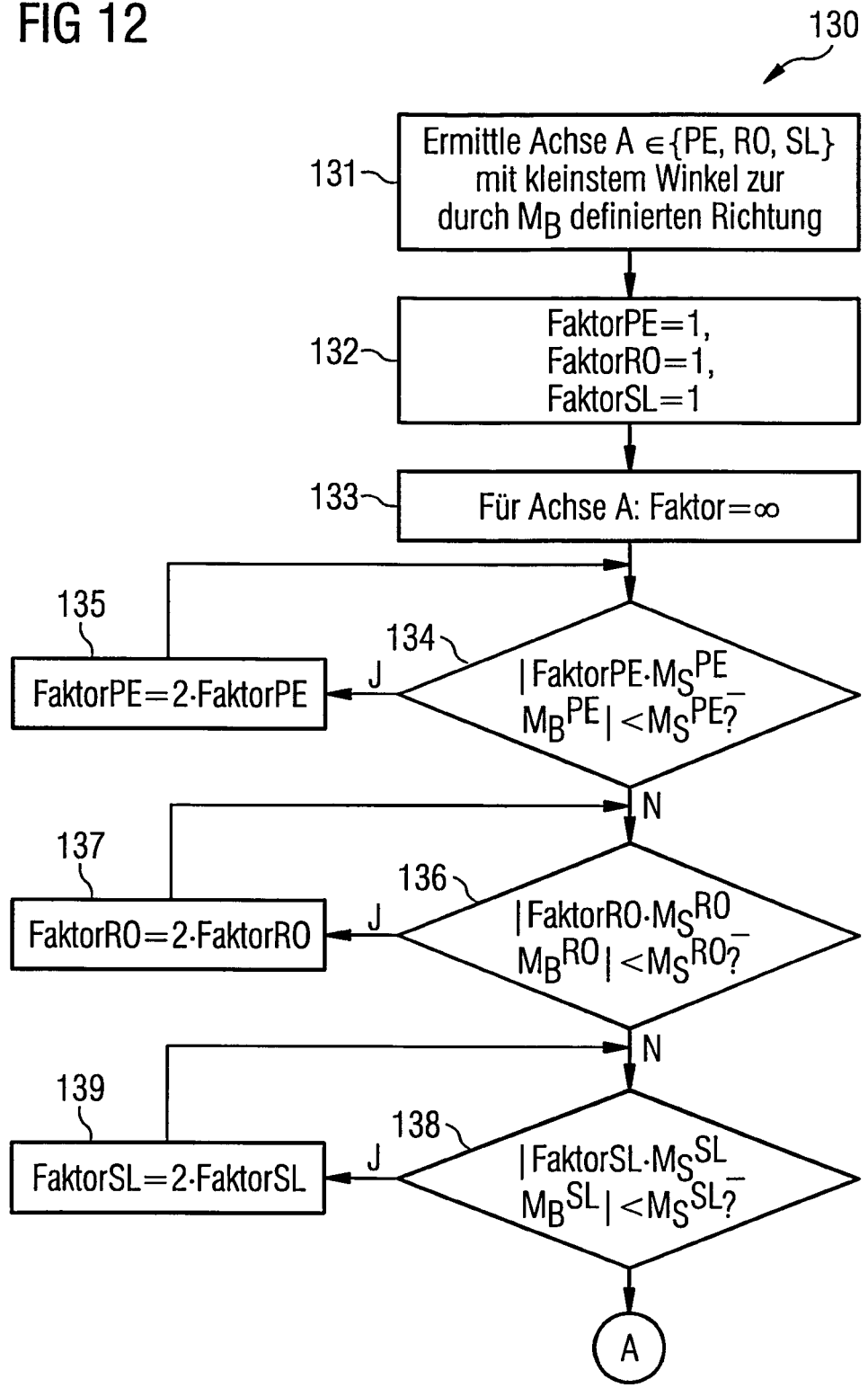
FIGS. 12 and 13 are flowcharts of a further exemplary embodiment of the inventive method.
Figure 13:
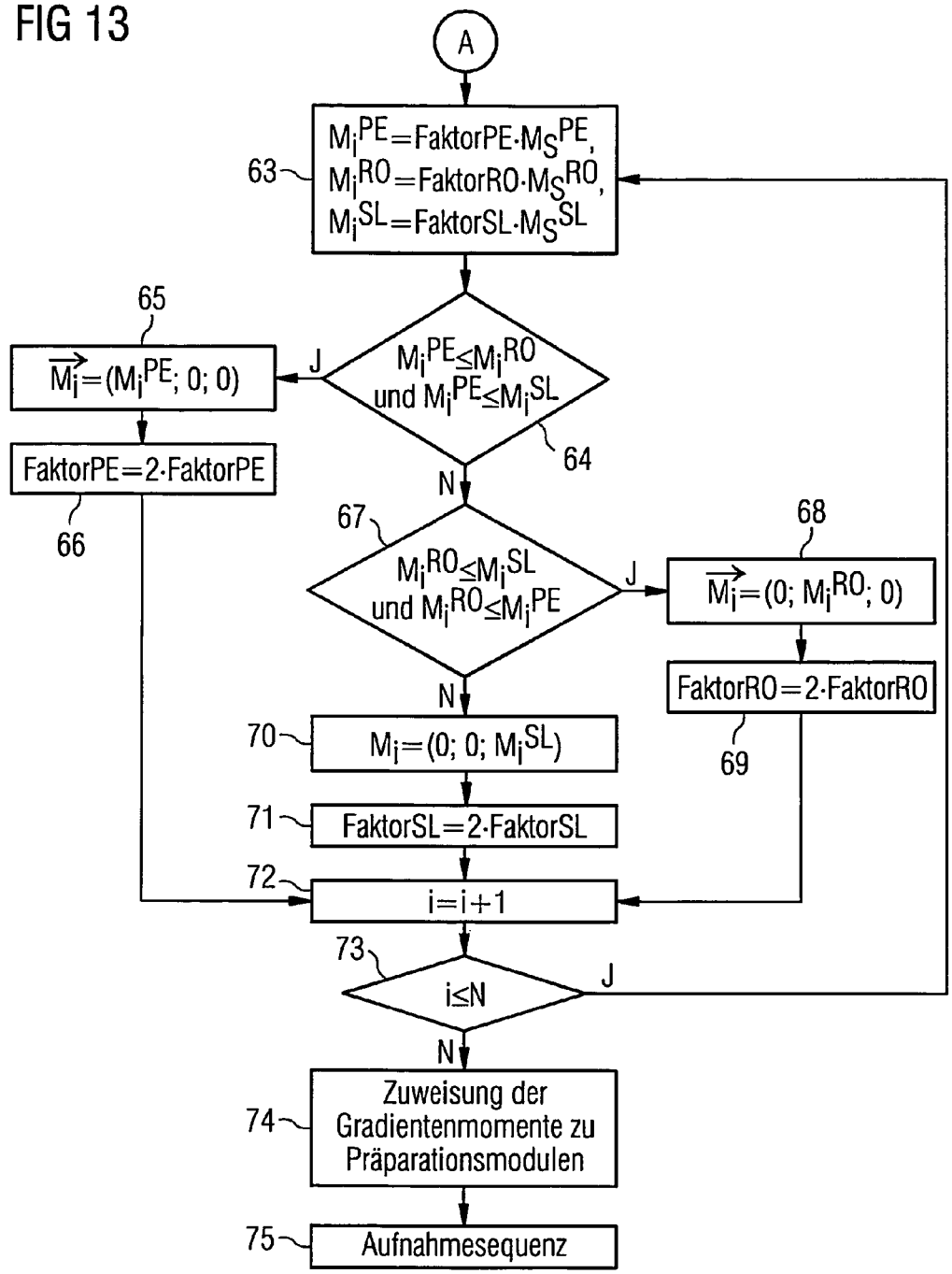

FIGS. 12 and 13 in combination show a flow diagram of a method 130 according to an exemplary embodiment. The method 130 is based on the method 60 described with reference to FIG. 7. The imaging gradient moment can be taken into account via a selection of the initial values for FactorPE, FactorRO and FactorSL depending on the imaging gradient moment that takes place in Steps 131-137.

At 131, that one of the three spatial directions is determined that, in the abstract space of the gradient moment, has the smallest angle with a line $$m \cdot \vec{M}_B \quad (10)$$

with a real parameter m that parameterizes the line.

At 132, FactorPE, FactorRO and FactorSL are respectively set equal to 1.

At 133 the factor that is associated with the axis A includes the smallest angle with the line according to Equation (10) is set to a large value, for example infinity.

In Steps 134-139, the values for the variables FactorPE, FactorRO and FactorSL that are associated with the two other spatial directions are subsequently selectively doubled in order to establish a sufficient distance from the line that is provided by Equation (10). Expressed in a different way, the points of a population matrix for which the compliance with the incommensurability condition according to Equations (2a)-(2c) could not be ensured can already be excluded.

At 134 a check can be made as to whether $$|\text{FactorPE} \cdot M_S^{PE} - M_B^{PE}| < M_S^{PE}, \quad (11)$$

wherein $M_S^{PE}$ can be defined by Equation (4) or Equation (5). In the event that this is the case, at 135 the variable FactorPE is doubled. The method returns to 134. The selective doubling is continued until a sufficient distance from $M_B^{PE}$ is established. In the event that Equation (11) is not satisfied, the method continues at 136.

At 136 a check can be made as to whether $$|\text{FactorPE} \cdot M_S^{RO} - M_B^{RO}| < M_S^{RO}, \quad (12)$$

wherein $M_S^{RO}$ can be defined by Equation (4) or Equation (5). In the event that this is the case, at 137 the variable FactorRO is doubled. The method returns to 136. The selective doubling is continued until a sufficient distance from $M_B^{RO}$ is established. In the event that Equation (12) is not satisfied, the method continues at 138.

At 138 a check can be made as to whether $$|\text{FactorPE} \cdot M_S^{SL} - M_B^{SL}| < M_S^{SL}, \quad (12)$$

wherein $M_S^{SL}$ can be defined by Equation (4) or Equation (5). In the event that this is the case, at 139 the variable FactorSL is doubled. The method returns to 138. The selective doubling is continued until a sufficient distance from $M_B^{SL}$ is established. In the event that Equation (13) is not satisfied, the method continues with the steps shown in FIG. 13.

The subsequent Steps 63-75 of the method 130 correspond to Steps 63-75 of the method 60 from FIG. 7. Due to the preceding Steps 131-139, one or more of the initial values for the variables FactorPE, FactorRO, FactorSL can be respectively greater than 1. This can lead to correspondingly larger spoiler gradient moments.

The effect of Steps 131-139 can be understood as illustrated so that a sufficient distance from the line defined by Equation (10) is thereby established in order to avoid a violation of the incommensurability condition according to Equations (2a)-(2c). This is illustrated in FIG. 14.

Figure 14:
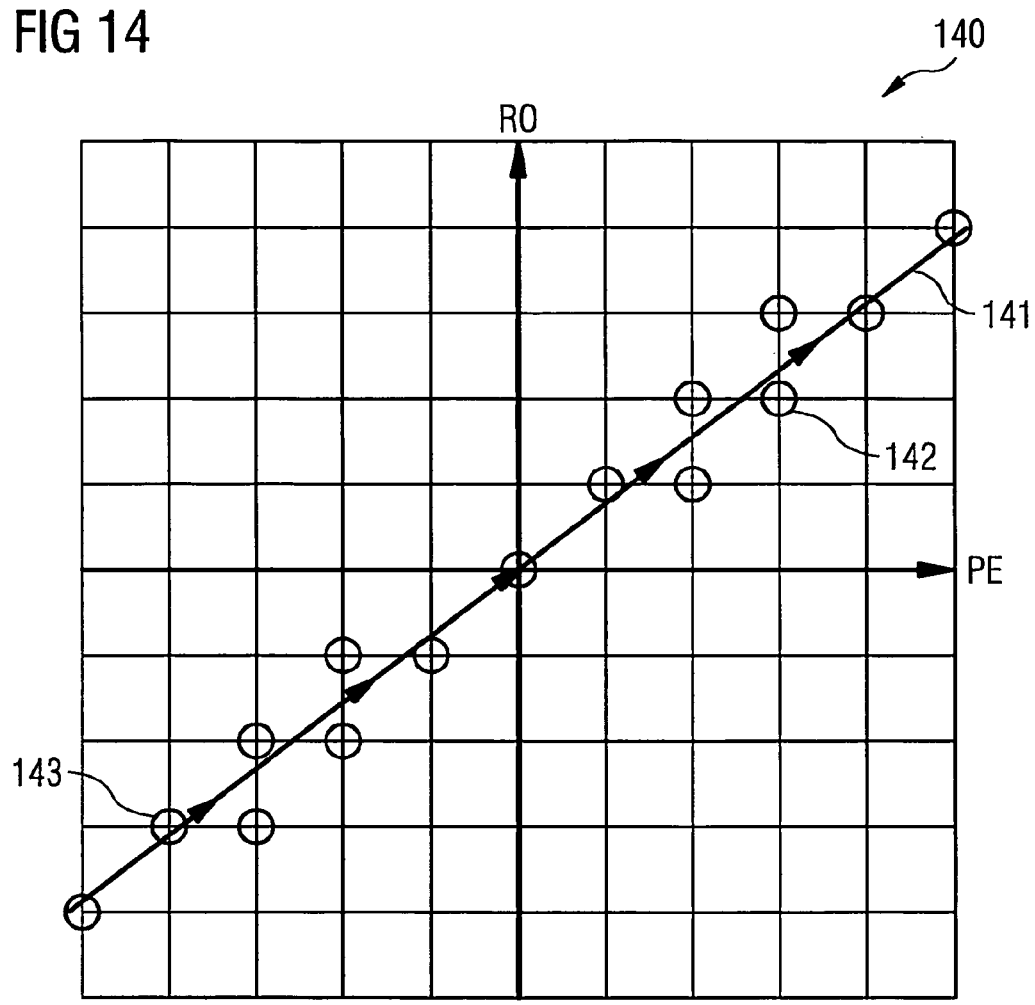
FIG. 14 shows a population matrix to illustrate the method of FIGS. 12 and 13.

FIG. 14 depicts a population matrix 140 in the PE- and RO-plane. A sufficient distance from the line 141 defined by Equation (10) whose direction corresponds to the imaging gradient moment must be ensured. Otherwise, the incommensurability condition according to Equations (2a)-(2c) could be violated. This distance is achieved in that the fields situated adjacent to the line 141 are precluded whose distance from the line 141 is less than $M_S^{PE}$ in the PE-direction and less than $M_S^{RO}$ in the RO-direction and less than $M_S^{SL}$ in the SL-direction.

A method in which a population matrix is filled sequentially and in which the simultaneous application of spoiler gradient moments along multiple spatial axes is possible can also be adapted depending on the imaging gradient moment. For example, the method from FIG. 10 can be implemented as follows.

In Step 101 the spoiler gradient moments $\vec{M}_i$ are determined with the method 130 from FIGS. 12 and 13.

In Step 104, all fields are marked as forbidden that are located at a distance of less than $M_S^{PE}$ in the PE-direction and less than $M_S^{RP}$ in the RO-direction and of less than $M_S^{SL}$ in the SL-direction from the line that is defined by Equation (10) and whose direction is defined by the imaging gradient moments.

Numerous modifications and developments of the devices and methods described in detail can be realized in additional exemplary embodiments.

In the event that gradient pulses that do not serve for gradient spoiling are used in some of the preparation modules, these can be rephased. It can thus be prevented that the gradient moments of these gradient pulses interfere with the spoiler gradient moments.

The maximum amplitude of the spoiler gradient moments can be limited specific to the application. For example, axis-specific limit values $M_L^{PE}$, $M_L^{RO}$ and $M_L^{SL}$ can be defined. The termination condition in Step 73 of the method 60 from FIG. 7 or of the method 80 from FIG. 8 can be adapted accordingly [sic] that a termination takes place in the event that i>N or in the event that $M_i^{PE} > M_L^{PE}$ in the event that $M_i^{RO} > M_L^{RO}$ or in the event that $M_i^{SL} > M_L^{SL}$. Given the method in which a population matrix is filled, as in FIG. 10, the axis-specific limit values $M_L^{PE}$, $M_L^{RO}$ and $M_L^{SL}$ can already be accounted for in the generation of the population matrix.

In the event that the number N' of spoiler gradient moments (i.e. i−1 at the point in time of the termination) is less than the number N of preparation modules for which a spoiler gradient moment should be switched, the spoiler gradient moments can be used in a cyclical manner for the various preparation modules: $\vec{M}_1, \vec{M}_2, \ldots, \vec{M}_{N'}, \vec{M}_1, M_2, \ldots \vec{M}_N$ etc. Alternatively, the determined spoiler gradient moments within each series of preparation modules $P_j^1, P_j^2, \ldots, P_j^N$ could be used. This means that the same spoiler gradient moments can be used for each of the different series of preparation modules. In the event that sufficiently many spoiler gradient moments can be determined that satisfy the incommensurability condition, these can also cover multiple series of preparation modules without a sequence of spoiler gradient moments having to be repeated in each series of preparation modules.

The assignment of the established spoiler gradient moments to the different preparation modules can take place in different suitable ways. For example, spoiler gradient moments with maximum amplitude $\|\vec{M}_i\|$ can be applied immediately before the respective first imaging module $B_j^1$ in order to maximally diphase the last generated transversal magnetization.

The polarity of the spoiler gradient moments can be selected arbitrarily. For example, the polarity can be selected such that all spoiler gradient moments $\bar{M}_i$ lie within a half-plane or a half-space of the space of spoiler gradient moments. In this way a strong suppression of signal paths that primarily lead to rephrasing can be achieved.

The methods and devices according to exemplary embodiments can combine gradient spoiling with RF spoiling. For example, an RF spoiling can be used such that a phase incrementing takes place not only between the respective first preparation modules $P_1^1$, $P_2^1$ etc. of different series of preparation modules, but rather also within each series of preparation modules $P_1^1$, $P_1^2$, . . . , $P_1^L$. For example, the quadratic increment rule that is described by Y. Zur in "Spoiling of Transverse Magnetization in Steady-State Sequences", MRM 21, 251-263 (1991) can be adapted accordingly. An exemplary embodiment is described in detail with reference to FIGS. 15-18.

FIG. 15 shows a flow diagram of a method 150 according to an exemplary embodiment. The method combines gradient spoiling and RF spoiling.

At 151, spoiler gradient moments are established. For example, the establishment of the spoiler gradient moments can take place according to any of the methods described with reference to FIGS. 7-14.

At 152 a phase of the RF pulses is established for each first preparation module $P_1^1$, $P_2^1$ etc. of the different series of successive preparation modules. The phase can define the phase position or, respectively, the angle of the radiated RF pulse in a rotating coordinate system (rotating around the B0 field). A quadratic increment rule—as it is described by Y. Zur in "Spoiling of Transverse Magnetization in Steady-State Sequences", MRM 21, 251-263 (1991), for example—can be used to establish the phases.

At 153, phases of the respective applied RF pulses are established for the subsequent preparation modules of the different series, i.e. for the preparation modules $P_1^2$, $P_1^3$, . . . , $P_1^N$ of the first series of preparation modules, for the preparation modules $P_2^2$, $P_2^3$, . . . , $P_2^N$ of the second series of preparation modules. As is described in detail with reference to FIG. 17, the establishment can likewise take place according to a quadratic increment rule. In this case, an interleaved quadratic increment method is realized in Steps 152 and 153.

At 154, the acquisition sequence is implemented, wherein the established spoiler gradient moments and the established phases for the RF pulses are used.

FIG. 16 shows a flowchart of a procedure 160 that can be used to establish the phases of the RF pulses in Step 152 of the method 150. A quadratic increment rule is used. The procedure can be used in order to establish the phase $\Phi_j^{(1)}$ for the RF pulse in the preparation module $P_j^1$.

At 161, a phase φ=1 is set. Moreover, an additional phase ϕ=0 is set, and an angle increment $\phi_{inc}$ is set to a predetermined, fixed value δψ. The value δψ can be equal to 117°, 50°, 84° or another suitable value, for example. An index i is set to 1.

At 162, φ is incremented to $\phi_{inc}$.

At 163, ϕ is incremented by φ.

At 164, a check is made as to whether i is equal to j. In the event that this is not the case, i is incremented at 165. The method returns to 162.

In the event that i=j, at 166 the phase $\phi_j^{(1)}$ for the RF pulse in the preparation module $P_j^1$ is set to ϕ. A quadratic incrementing rule exists due to the incrementing of the different angles in Steps 162 and 163.

Figure 17:
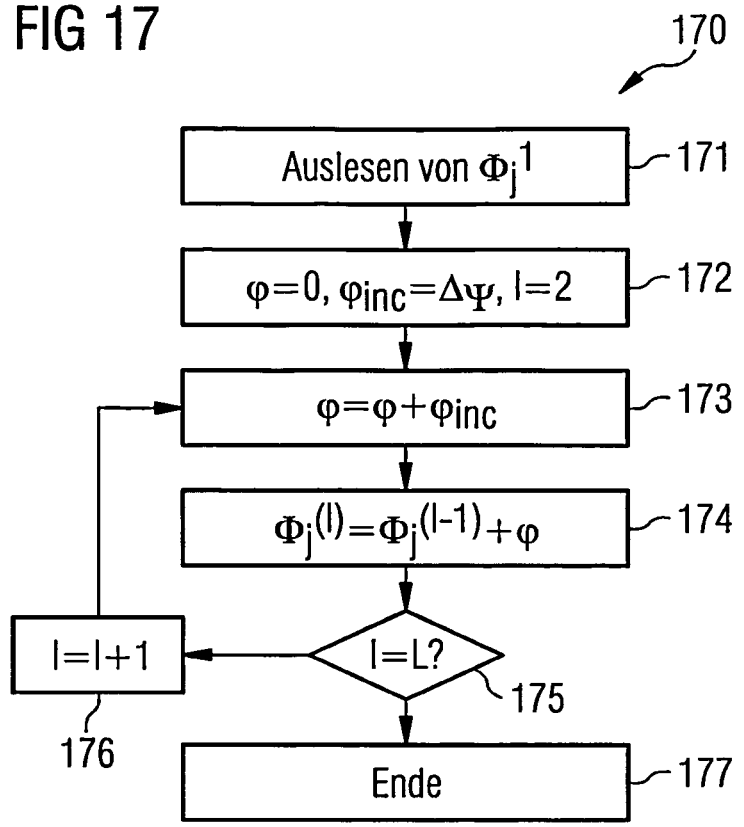
FIG. 17 is a flowchart of an additional procedure that is usable in the method of FIG. 15.

FIG. 17 shows a flowchart of a procedure 170 that can be used to establish the phases of the RF pulses in Step 153 of the method 150. A quadratic increment rule is thereby used in turn. However, this is now applied to the different preparation modules of the series of preparation modules that are implemented before an imaging module. The procedure can be used in order to establish the phase $\phi_j^{(1)}$ for the RF pulse in the second, third or, respectively, generally l-th preparation module $P_j^l$ of the j-th series of preparation modules.

In the flowchart of FIG. 17, j designates the corresponding series of preparation modules and l designates the index that identifies the different preparation modules within the series.

At 171, the phase of the RF pulse for the first preparation module $P_j^1$ of the series is read out. This value can be determined as described with reference to FIG. 16.

At 172, a phase ϕ=0 is set and an angle increment $\phi_{inc}$ is set to a predetermined, fixed value δψ. For example, the value δψ can be set equal to 117°, 50°, 84° or another suitable value. An index l is set to 2.

At 173, ϕ is incremented by $\phi_{inc}$.

At 174, $\phi_j^{(l)}$ is calculated according to $$\Phi_j^{(l)} = \Phi_j^{(l-1)} + \phi \qquad (14)$$

At 175, a check is made as to whether the index l corresponds to the last preparation module of the series, i.e. whether l=L is the case. In the event that this is not the case, l is incremented at 176. The method returns to 173.

In the event that it is determined at 175 that l=L, the procedure ends at 177. The procedure can be repeated for the different series of preparation modules.

By the incrementing of the different angles in Steps 173 and 174, a quadratic incrementing rule exists, but now within the series of preparation modules applied before the imaging module $B_j^l$.

Through the procedures of FIG. 15 and FIG. 16, an effective RF spoiling can be achieved both with sequential j (i.e. from series to series) and with sequential l (i.e. within a series of preparation modules). The second incrementing rule according to the procedure 170 of FIG. 17 can also be expanded to the subsequent imaging modules.

Figure 18:
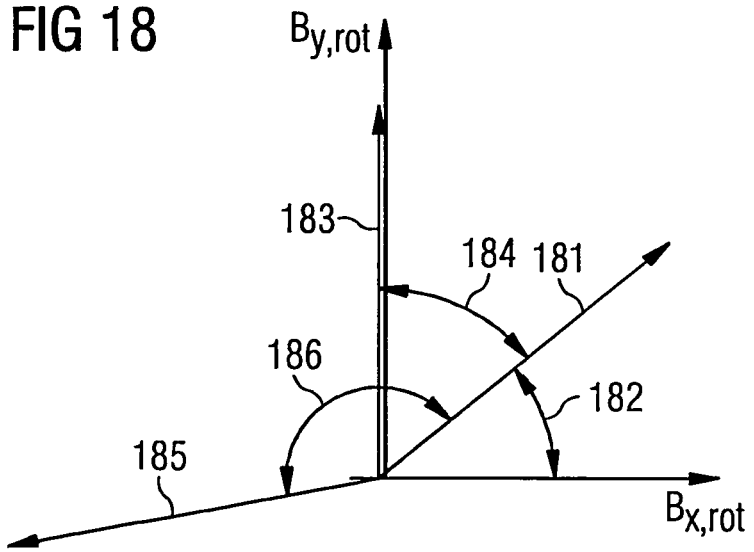
FIG. 18 illustrates a radio-frequency spoiling according to the procedure of FIG. 17.

FIG. 18 illustrates the RF spoiling according to the interleaved quadratic incrementing rule. A magnetic field 181 of an RF pulse that is applied in the first preparation module $P_j^1$ a series has a phase position 182. This can be defined in a reference system rotating around the basic field.

A magnetic field 183 of an RF pulse that is applied in the second preparation module $P_j^2$ of a series has a phase position 184 relative to the first RF pulse. A magnetic field 185 of an RF pulse that is applied in the third preparation module $P_j^3$ of a series has a phase position 186 relative to the first RF pulse. The phase positions 184, 186 within the series of preparation modules are determined according to the quadratic incrementing rule of the procedure 170 from FIG. 17.

With methods and devices according to the exemplary embodiments, unwanted coherences that can result via the history of the manipulation of the magnetization in multiple preparation and imaging modules can be suppressed. For example, artifacts can thereby be reduced.

FIG. 19 shows an MR image 191 that was acquired with a conventional method, in comparison with an MR image 192 of the same subject that was acquired according to an exemplary embodiment. The use of gradient spoiling according to one exemplary embodiment and of RF spoiling leads to a reduction of artifacts and to an improvement of the image quality.

Although modifications and changes may be suggested by those skilled in the art, it is the intention of the inventors to embody within the patent warranted hereon all changes and modifications as reasonably and properly come within the scope of their contributions to the art.

We claim as our invention:

1. A method for acquiring magnetic resonance (MR) imaging data, comprising:

operating a magnetic resonance data acquisition unit, with an examination subject therein, with an imaging data acquisition sequence comprising multiple preparation modules and at least one imaging module, with each of said multiple preparation modules preparing a magnetization of nuclear spins in the examination subject and wherein magnetic resonance signals, originating from said nuclear spins, are acquired in said at least one imaging module;

in the respective multiple preparation modules, generating spoiler gradient magnetic fields that produce a transverse magnetization of said nuclear spins in the examination subject, with a spoiler gradient magnetic field generated in one of said preparation modules being spatially variable along a first spatial direction among three orthogonal spatial directions, and, in another of said preparation modules, generating a spoiler gradient magnetic field that is spatially variable along a direction among three orthogonal spatial directions that is different from said first spatial direction;

generating said spoiler gradient magnetic fields with respective spoiler gradient moments that cause, for at least one of said three orthogonal spatial directions, a weighted sum of the spoiler gradient moments along said at least one of said three orthogonal spatial directions to satisfy a threshold condition; and entering said acquired magnetic resonance signals into a data file, and making said data file available in electronic form.

2. A method as claimed in claim 1 comprising selecting said spoiler gradient moments by establishing respective spoiler gradient moments for the multiple preparation modules in an iterative method.

3. A method as claimed in claim 2 comprising, in one iteration of said iterative method, generating a spoiler gradient magnetic field along a first spatial direction among said three orthogonal spatial directions dependent on a second maximum of spoiler gradient moments that are generated along a second spatial direction among said three orthogonal spatial directions, that is different from said first spatial direction, said second maximum being a maximum of the spoiler gradient moments established in iterations in said iterative method preceding said one of said iterations.

4. A method as claimed in claim 3 comprising, in said one of said iterations, establishing said spoiler gradient moment along said first of said spatial directions dependent on a first maximum of spoiler gradient moments along said first spatial direction established in said iterations preceding said one of said iterations.

5. A method as claimed in claim 4 comprising comparing twice said first maximum with said second maximum, and establishing said gradient moment along said first of said spatial directions dependent on a result of said comparison.

6. A method as claimed in claim 2 comprising, in said iterative method, sequentially filling a multi-dimensional population matrix, in a spoiler gradient moment domain, with values of said spoiler gradient moments established in successive iterations.

7. A method as claimed in claim 6 comprising excluding fields in said population matrix dependent on said threshold condition.

8. A method as claimed in claim 1 comprising, in said one of said preparation modules, generating said spoiler gradient magnetic field along said one of said directions as a first spoiler gradient field having a spoiler gradient moment that is a whole-number multiple of a first threshold, and generating said spoiler gradient magnetic field along said another direction as a second spoiler gradient field having a spoiler gradient moment that is a whole number multiple of a second threshold.

9. A method as claimed in claim 8 wherein said first threshold and said second threshold are different from each other.

10. A method as claimed in claim 8 comprising setting said first threshold dependent on an extent of an imaging voxel in said one of said three orthogonal spatial directions, and setting said second threshold dependent on an extent of an imaging voxel in said another of said three orthogonal spatial directions.

11. A method as claimed in claim 1 comprising, in said at least one of said preparation modules, generating a both a first spoiler gradient magnetic field that is spatially variable in said one of said spatial directions, and generating a second spoiler gradient magnetic field that is spatially variable along said another of said spatial directions of said three orthogonal spatial directions.

12. A method as claimed in claim 1 wherein said three orthogonal spatial directions correspond to a phase coding direction, a frequency coding direction, and a slice coding direction for said sequence.

13. A method as claimed in claim 1 comprising:

selecting the spoiler gradient moments of the spoiler gradient fields so that, for each $N^{th}$ set of coefficients $\{f_1, f_2, \ldots, f_N\}$ that is not equal to $\{0, 0, \ldots, 0\}$ and in which each coefficient $f_i$ (with $1 \leq i \leq N$) is selected from the group $\{-1; 0; 1\}$, wherein N designates a number of said preparation modules the following condition is satisfied for at least one spatial direction (Dir) of the three orthogonal spatial directions:

$$|\Sigma_{i=1 \ldots N} f_i \cdot M_i^{Dir}| \geq M_S^{Dir},$$

wherein i is an index for respective preparation modules,

Dir is selected from a phase coding direction, a frequency coding direction and a slice selection direction, $M_i^{Dir}$ is a threshold associated with the corresponding spatial direction; and $M_S^{Dir}$ is a threshold associated with the corresponding spatial direction.

14. A method as claimed in claim 13 comprising selecting the respective spoiler gradient moments to cause said condition to be satisfied for more than one of said three orthogonal spatial directions.

15. A method as claimed in claim 13, comprising:

setting the threshold to be $$M_S^{Dir} = 2 \cdot \pi / (\gamma \cdot d^{Dir}),$$

wherein $\gamma$ is a gyromagnetic ratio of a kernel, and $d^{Dir}$ is an extent of an imaging voxel in the direction Dir.

16. A method as claimed in claim 1 comprising selecting the respective spoiler gradient moments of the spoiler gradient magnetic fields dependent on an imaging gradient moment generated in said imaging modules.

17. A method as claimed in claim 16, comprising:
selecting the spoiler gradient moments of the spoiler gradient fields so that for each $N^{th}$ set of coefficients $\{f_1, f_2, \ldots, f_N\}$ that is not equal to $\{0, 0, \ldots, 0\}$ and in which each coefficient $f_i$ (with $1 < i < N$) is selected from a group $\{-1; 0; 1\}$, wherein N designates a number of said preparation modules, and for each K-tuple of coefficients $\{g_1, g_2, \ldots, g_K\}$ in which each coefficient $g_j$ (with $1 \leq j \leq K$) is selected from the group $\{-1; 0; 1\}$, wherein K designates a number of imaging modules, the following condition is satisfied for at least one spatial direction (Dir) of the three orthogonal spatial directions:

$$|(\Sigma_{i=1\ldots N} f_i \cdot M_i^{Dir}) + (\Sigma_{j=1\ldots K} g_j \cdot M_B^{Dir})| \geq M_S^{Dir},$$

wherein i is an index for respective preparation modules, j is an index for respective imaging modules, Dir is selected from a phase coding direction, a frequency coding direction and a slice selection direction, $M_i^{Dir}$ is a spoiler gradient moment along the corresponding spatial direction in the i-th preparation module, $M_B^{Dir}$ is an imaging gradient moment along the corresponding spatial direction in the imaging modules, $M_S^{Dir}$ is a threshold associated with the corresponding spatial direction.

18. A method as claimed in claim 17 comprising selecting the respective spoiler gradient moments to cause said condition to be satisfied for more than one of said three orthogonal spatial directions.

19. A method as claimed in claim 17, comprising:
setting the threshold to be $$M_S^{Dir} = 2 \cdot \pi (\gamma \cdot d^{Dir}),$$

wherein γ is a gyromagnetic ratio of a kernel, and $d^{Dir}$ is an extent of an imaging voxel in the direction Dir.

20. A method as claimed in claim 1 comprising in said sequence, additionally generating radio-frequency spoiling.

21. A magnetic apparatus comprising:
a magnetic resonance data acquisition unit;
a control unit configured to operate said magnetic resonance data acquisition unit, with an examination subject therein, with an imaging data acquisition sequence comprising multiple preparation modules and at least one imaging module, with each of said multiple preparation modules preparing a magnetization of nuclear spins in the examination subject and wherein magnetic resonance signals, originating from said nuclear spins, are acquired in said at least one imaging module;

said control unit being configured to operate said magnetic resonance data acquisition unit, in the respective multiple preparation modules, to generate spoiler gradient magnetic fields that produce a transverse magnetization of said nuclear spins in the examination subject, with a spoiler gradient magnetic field generated in one of said preparation modules being spatially variable along a first spatial direction among three orthogonal spatial directions, and to generate, in another of said preparation modules, a spoiler gradient magnetic field that is spatially variable along a direction among three orthogonal spatial directions that is different from said first spatial direction;

said control unit being configured to operate said magnetic resonance data acquisition unit to generate said spoiler gradient magnetic fields with respective spoiler gradient moments that cause, for at least one of said three orthogonal spatial directions, a weighted sum of the spoiler gradient moments along said at least one of said three orthogonal spatial directions to satisfy a threshold condition; and said control unit being configured to enter said acquired magnetic resonance signals into a data file, and make said data file available in electronic form.

* * * * *